United States Patent [19]
Little, Jr.

[11] Patent Number: 5,965,899
[45] Date of Patent: Oct. 12, 1999

[54] MINIBAND TRANSPORT QUANTUM WELL DETECTOR

[75] Inventor: John W. Little, Jr., Ellicott City, Md.

[73] Assignee: Lockheed Martin Corp., Nashua, N.H.

[21] Appl. No.: 08/300,097

[22] Filed: Sep. 1, 1994

Related U.S. Application Data

[63] Continuation of application No. 07/906,417, Jun. 30, 1992, abandoned, which is a continuation-in-part of application No. 07/606,285, Oct. 31, 1990, abandoned.

[51] Int. Cl.$^6$ ................................................ H01L 29/15
[52] U.S. Cl. ........................................ 257/17; 257/25
[58] Field of Search ................................................ 257/17

[56] References Cited

U.S. PATENT DOCUMENTS

| | | | |
|---|---|---|---|
| Re. 32,893 | 3/1989 | Miller | 250/214.1 |
| 4,546,244 | 10/1985 | Miller | 250/214.1 |
| 4,665,412 | 5/1987 | Ohkawa et al. | 257/17 |
| 4,720,309 | 1/1988 | Deveaud et al. | 148/32.1 |
| 4,727,341 | 2/1988 | Nishi et al. | 332/251 |
| 4,745,452 | 5/1988 | Sollner | 372/43 |
| 5,036,371 | 7/1991 | Schwartz | 257/17 |
| 5,047,822 | 9/1991 | Little, Jr. et al. | 350/355 |

FOREIGN PATENT DOCUMENTS

| | | |
|---|---|---|
| 232431 | 8/1987 | European Pat. Off. . |
| 275150 | 7/1988 | European Pat. Off. . |
| 380939 | 8/1990 | European Pat. Off. . |
| WO8909425 | 10/1987 | WIPO . |

OTHER PUBLICATIONS

D. Coon et al., "New Mode of IR Detection Using Quantum Wells", *Appl. Phys. Lett.*, vol. 45, pp. 649–651 (Sep. 15, 1984).

D. Coon et al., "Narrow Band Infrared Detection in Multiquantum Well Structures", *Appl. Phys. Lett.*, vol. 47, pp. 289–291 (Aug. 1, 1985).

E. Corcoran, "Diminishing Dimensions", *Scientific American* vol. 263, pp. 122–131 (Nov. 1990).

G. Dohler, "Solid–State Superlattices", *Scientific American* vol. 249, pp. 144–151 (Nov. 1983).

G. Hasnain et al., "Mid–Infrared Detectors in the 3–5 $\mu$m Band Using Bound to Continuum State Absorption in InGaAs/InAlAs Multiquantum Well Structures", *Appl. Phys. Lett.* vol. 56, pp. 770–772 (Feb. 19, 1990).

B. Leavitt et al., "Stark Ladders in Strongly Coupled Superlattices and Their Interactions with Embedded Quantum Wells", *Phys. Rev. B* vol. 41, pp. 5174–5177 (Mar. 5, 1990).

B. Levine et al., "New 10 $\mu$m Infrared Detector Using Intersubband Absorption in Resonant Tunneling GaAlAs Superlattices", *Appl. Phys. Lett.* vol. 50, pp. 1092–1094 (Apr. 20, 1987).

B. Levine et al., "High Detectivity D*=$1.0\times10^{10}$cm Hz/W GaAs/AlGaAs Multiquantum Well $\lambda$=8.3$\mu$m Infrared Detector", *Appl. Phys. Lett.* vol. 53, pp. 296–298 (Jul. 25, 1988).

(List continued on next page.)

*Primary Examiner*—Jerome Jackson, Jr.
*Assistant Examiner*—Bradley William Baumelster
*Attorney, Agent, or Firm*—W. H. Meise; D. W. Gomes

[57] ABSTRACT

A semiconductor device for detecting radiation includes a plurality of quantum well layers, each of which has bound ground and excited states, interleaved with a plurality of superlattice barrier layers, each of which has a miniband of energy states. By selection of the thicknesses and compositions of the layers, the excited states of the quantum wells have energies that are approximately equal to energies of states in the minibands. Thus, the excited states and minibands form a band of energy states that is substantially continuous across the pluralities of layers. Carriers are excited from the quantum wells' ground states to the excited states by photon absorption and are swept into and through the minibands by an externally applied electric field. The carriers are collected as photocurrent. The excited states may be selectively positioned in the minibands to tailor the properties of the devices, which can have both n-type and p-type dopants. Devices that respond to more than one wavelength band are also disclosed.

20 Claims, 14 Drawing Sheets

OTHER PUBLICATIONS

B. Levine et al., "High Sensitivity Low Dark Current 10 μm GaAs Quantum Well Infrared Photodetectors", *Appl. Phys. Lett.* vol. 56, pp. 851–853 (Feb. 26, 1990).

E. Mendez et al., "Stark Localization in GaAs–GaAlAs Superlattices Under an Electric Field", *Phys. Rev. Lett.* vol. 60, pp. 2426–2429 (Jun. 6, 1988).

H. Sakaki et al., "Energy Levels and Electron Wave Functions in Semiconductor Quantum Wells Having Superlattice Alloylike Material (0.9 nm GaAs/0.9 nm AlGaAs) as Barrier Layers", *Appl. Phys. Lett.* vol. 47, pp. 295–297 (Aug. 1, 1985).

M. Sundaram et al., "New Quantum Structures", *Science* vol. 254, pp. 1326–1335 (Nov. 29, 1991).

J. Switzer et al., "Electrodeposited Ceramic Superlattices", *Science* vol. 247, pp. 444–445 (Jan. 26, 1990).

C. Weisbuch et al., *Quantum Semiconductor Structures,* pp. 19–20, Academic Press (1991).

L. West et al., "First Observation of an Extremely Large–Dipole Infrared Transition within the Conduction Band of a GaAs Quantum Well", *Appl. Phys. Lett.* vol. 46, pp. 1156–1158 (Jun. 15, 1985).

T. Wood et al., "Wavelength–Selective Voltage–Tunable Photodetector Made From Multiple Quantum Wells", *Appl. Phys. Lett.* vol. 47, pp. 190–192 (Aug. 1, 1985).

S.–R. Yang et al., "Theory of Conductivity in Superlattice Minibands", *Phys. Rev. B* vol. 37, pp. 10090–10094 (Jun. 15, 1988).

L. Yu et al., "A Metal Grating Coupled Bound–to–Miniband Transition GaAs Multiquantum Well/Superlattice Infrared Detector", *Appl. Phys. Lett.* vol. 59, pp. 1332–1334 (Sep. 9, 1991).

L. Yu et al., "Largely Enhanced Bound–to–Miniband Absorption in an inGaAs Multiple 59, Quantum Well with Short–Period Superlattice InAlAs/InGaAs Barrier", *Appl. Phys. Lett.* vol. pp. 2712–2714 (Nov. 18, 1991).

H. Kano et al., "Negative Differential Resistance Device Built in a Biwell GaAs/AlGaAs Superlattice", *J. Crystal Growth* vol. 81, pp. 144–148 (1987).

U. Koren et al., "InGaAs/InP Multiple Quantum Well Waveguide Phase Modulator", *Appl. Phys. Lett.* vol. 50, pp. 368–370 (Feb. 16, 1987).

T. Nakagawa et al., "Thermally Stimulated Resonant Current in AlGaAs/GaAs Triple Barrier Diodes", *Appl. Phys. Lett.* vol. 51, pp. 445–447 (Aug. 10, 1987).

T. Wood et al., "High–Speed 2=2 Electrically Drive Spatial Light Modulator Made with GaAs/AlGaAs Multiple Quantum Wells (MQWs)", *Elec. Lett.* vol. 23, pp. 916–917 (Aug. 13, 1987).

"The Quantum–Effect Devices: Tomorrow's Transistor", Scientific American, vol. 258, pp. 96–100 (Mar 1988), R. Bate, Jun. 30, 1992.

"Long Wavelength Infrared Detection in a Katalsky–type Superlattice Structure", Byongsung et al., Applied Physics Letters, vol. 57, No. 5, pp 503–505, Jul. 30, 1990.

"A Metal Grating Coupled Bound–to–Miniband Transition GAAs Multiquantum Well/Superlattice Infrared Detector", Yu et al., Applied Physics Letter, vol. 59, No. 11, 99 1332–1334, Sept. 9, 1991.

"Low Dark Current Step–Bound–to–Miniband Transition In GaAs/GaAs/AlGaAs Multiquantum–Well Infrared Detector", Yu et al., Applied Physics letters, vol. 60, No. 8, pp. 992–994, Feb. 24, 1992.

Patent Abstracts of Japan, vol. 15, No. 179 (E–1064), May 5,1991.

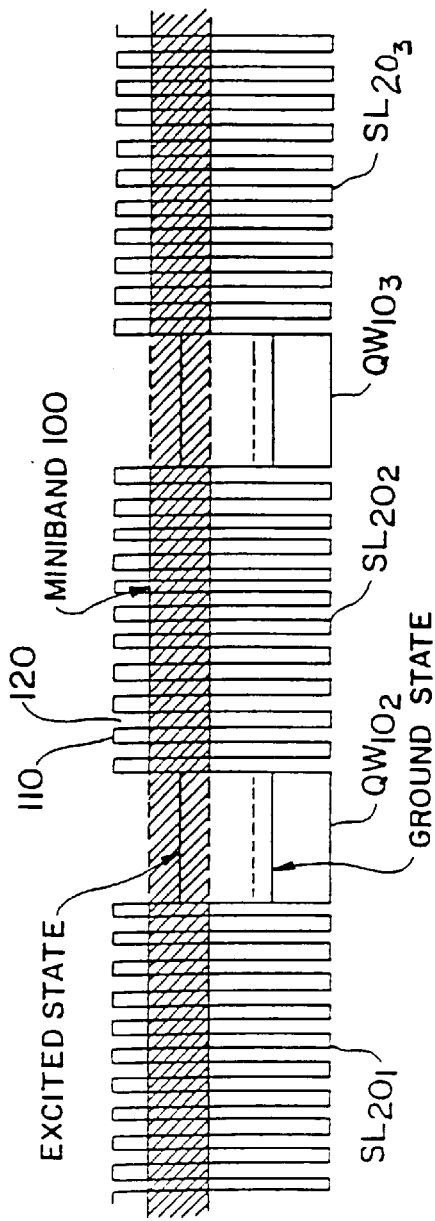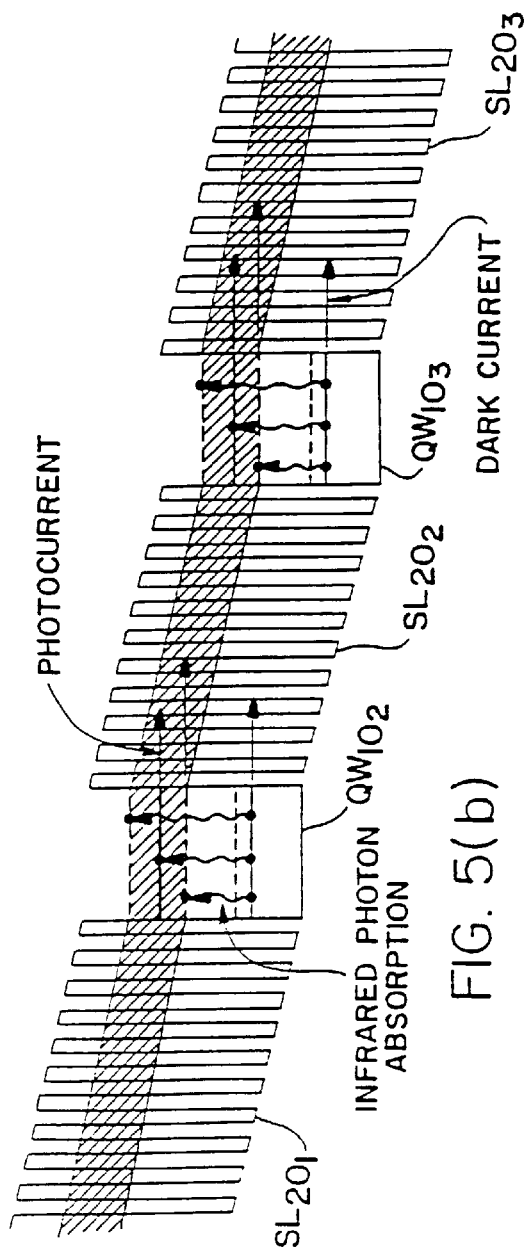
FIG. 5(a)
FIG. 5(b)

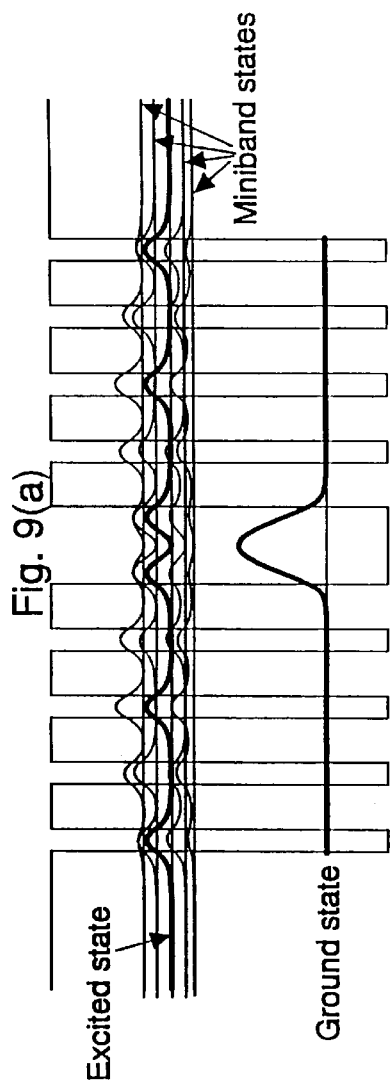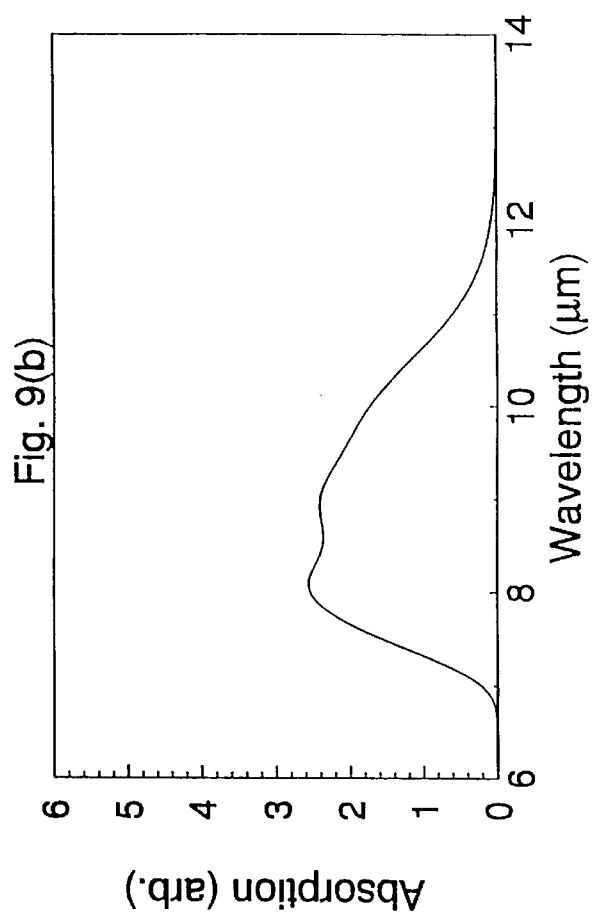

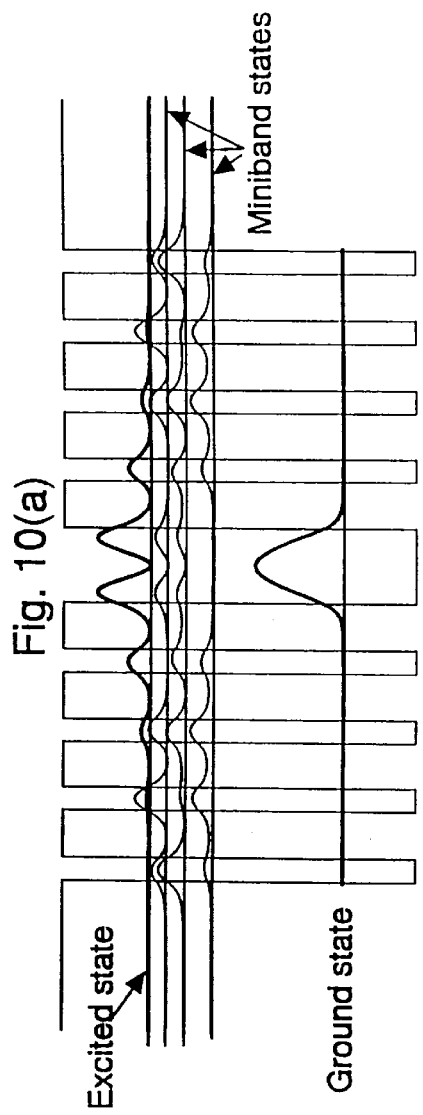
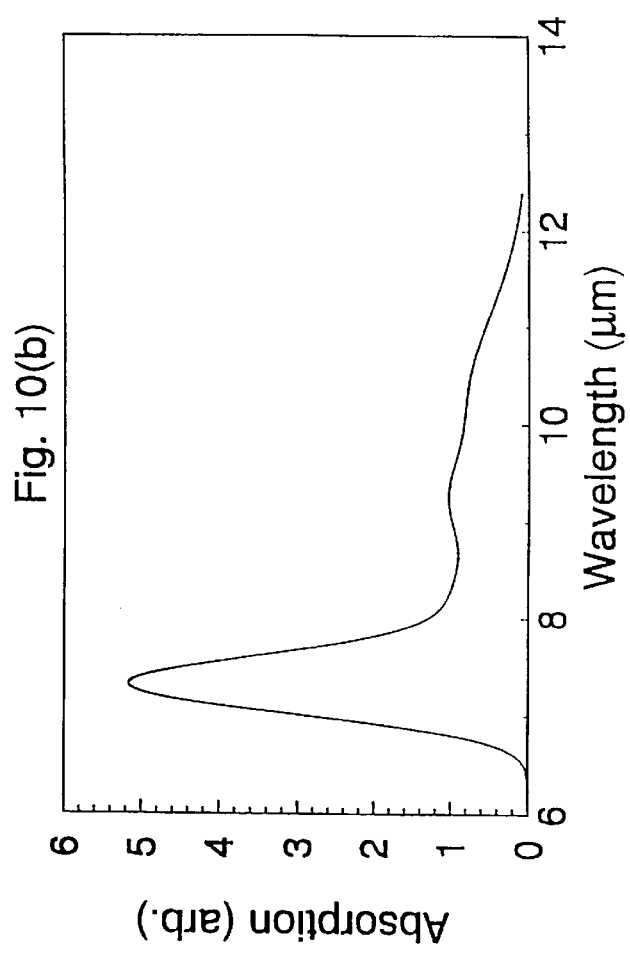
Fig. 10(a)
Fig. 10(b)

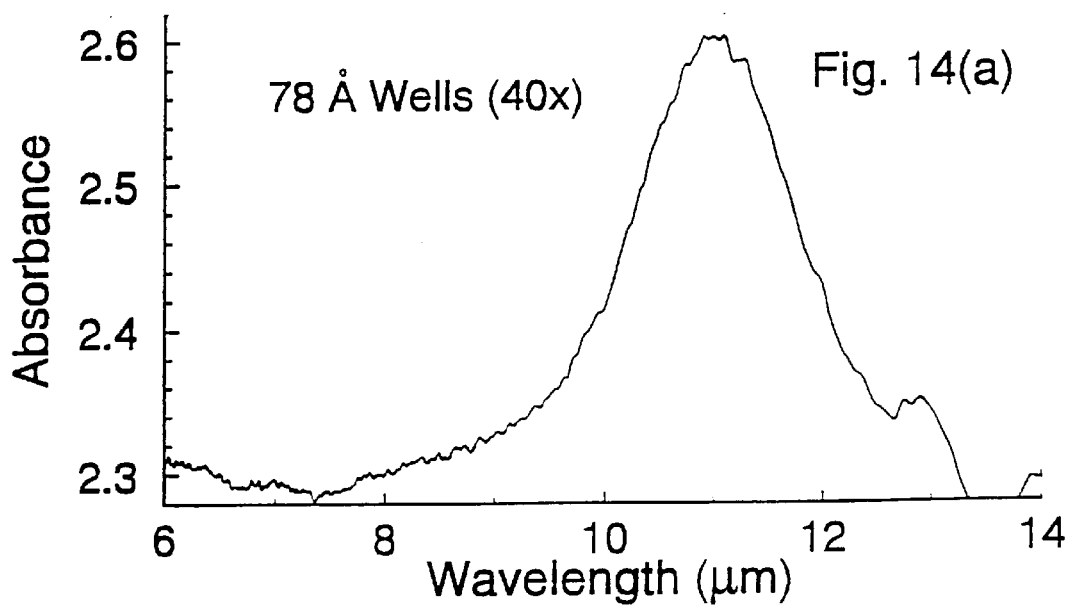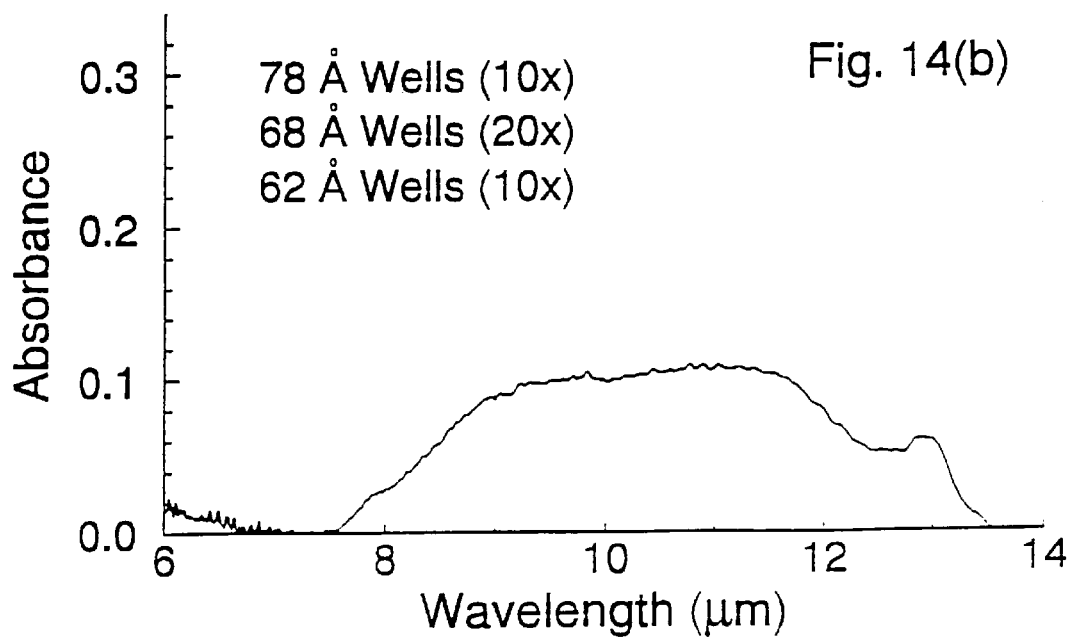

MINIBAND TRANSPORT QUANTUM WELL DETECTOR

This is a continuation of U.S. patent application Ser. No. 07/906,417, filed Jun. 30, 1992, now abandoned, which is a continuation-in-part of U.S. patent application Ser. No. 07/606,285, filed Oct. 31, 1990, and entitled "Miniband Transport Quantum Well Detector", now abandoned.

BACKGROUND

The present invention is directed to a semiconductor electromagnetic detector and a method of detecting electromagnetic radiation, and is directed particularly to a semiconductor infrared detector having doped quantum wells separated by finite-period superlattices.

Detection of electromagnetic radiation in the medium wavelength infrared (MWIR) band (wavelengths from 3–5 micrometers ($\mu$m)) can be accomplished with several materials, e.g., indium antimonide (InSb). On the other hand, there is only one common detector for the long wavelength infrared (LWIR) band (wavelengths from 8–12 $\mu$m): the narrow-band-gap semiconductor mercury cadmium telluride (HgCdTe).

Many problems with respect to the uniformity of optical and electrical properties and mechanical stability are associated with HgCdTe. As a result, routine fabrication of large HgCdTe detector arrays is not possible. In addition, detectors that are sensitive to more than one band of wavelengths at the same time (sometimes called "two-color" detectors) are not readily available.

Recently, semiconductor structures that have dimensions small enough to make quantum mechanical effects important have been described in the literature, e.g., M. Sundaram et al., "New Quantum Structures", Science vol. 254, pp. 1326–1335 (Nov. 29, 1991). Conventional quantum well infrared photodetectors (QWIPs) respond to thermal radiation with an increase in electrical conductivity that results from internal photoemission of charged carriers from energy states confined in quantum wells. Typical materials used for conventional QWIPs are III–V compound semiconductors such as gallium arsenide and aluminum gallium arsenide. A typical QWIP is a stack of layers in which the layers' materials and widths are carefully selected to achieve a desired distribution of energy states for the device's electrons. See, e.g., B. Levine et al., "New 10 $\mu$m Infrared Detector Using Intersubband Absorption in Resonant Tunneling GaAlAs Superlattices", Appl. Phys. Lett. vol. 50, pp. 1092–1094 (Apr. 20, 1987).

An example of the energy states in a conventional, unbiased QWIP such as that described in the Levine et al. paper is illustrated in FIG. 1(a). Such a conventional QWIP is described in. General aspects of superlattices, which typically are structures of thin alternating layers of two materials having different electronic properties, are described in G. Dohler, "Solid-State Superlattices", Scientific American vol. 249, pp. 144–151 (November 1983). It will be understood that superlattices, as well as the other structures described in this application, can be fabricated by a wide variety of methods, e.g., vapor deposition methods such as molecular-beam epitaxy and electrochemical deposition methods. See, e.g., J. Switzer et al., "Electrodeposited Ceramic Superlattices", Science vol. 247, pp. 444–445 (Jan. 26, 1990).

Three of the QWIP's quantum wells QW are seen in FIG. 1(a), and the wells have widths and energy depths that are chosen to provide two confirmed states, the ground state and the excited state. The energy separation between the ground state and the excited state is set equal to the energy of the photon to be detected by the QWIP, and generally increases as the width of the layers corresponding to the quantum wells QW decreases. The well layers are doped with electron donor impurities, e.g., silicon, thereby partially filling the lowest energy state with electrons (as indicated in the figure by the dashed lines). Barriers having thicknesses of typically one hundred Angstroms (100 Å) separate the quantum wells QW. In a QWIP consisting of a stack of GaAs wells and $Al_xGa_{1-x}As$ barriers, the depth of the wells can be varied over a range of about 500 mili-electron-volts (meV). As noted in the above-cited Sundaram et al. paper, the well depth is proportional to the difference between the bandgaps of the barrier and well layers, and varies almost linearly for $0.0 < x < 0.45$.

When a bias is applied to the QWIP as illustrated in FIG. 1(b), the shape of the distribution of energy states changes. Electrons can jump into the excited states upon absorption of photons having the proper energy, and can tunnel through the barriers separating the wells; these electrons are collected as a current. Conventional QWIPs operate at biases corresponding to internal electric fields of 10–30 kV/cm, which are required for efficient extraction of the photogenerated carriers before recombination. Due to the electrons' tunneling from the ground state through the thin barriers, however, the current that flows in the absence of photons (the "dark current") is unacceptably large in the conventional QWIP.

Another type of QWIP is described in B. Levine et al., "High-Detectivity $D^* = 1.0 \times 10^{10}$ cmvHz/W GaAs/AlGaAs Multiquantum Well $\lambda = 8.3$ $\mu$m Infrared Detector", Appl. Phys. Lett. vol. 53, pp. 296–298 (Jul. 25, 1988). An example of the energy states in such an unbiased QWIP is illustrated in FIG. 2(a). In this QWIP, the widths of the quantum wells QW are chosen so that only the ground state is bound in each well and the excited state is slightly above the barrier in the continuum. In such a QWIP, the barriers between the quantum wells are fairly thick, e.g., approximately 500 Å, thereby yielding lower dark current when a bias is applied as illustrated in FIG. 2(b). The carriers can still be collected because photon absorption raises the electrons into the continuum where they can be swept to the QWIP's contacts by the applied electric field before recombination occurs.

Although the QWIP illustrated in FIGS. 2(a)–2(b) has lower dark current than the QWIP illustrated in FIGS. 1(a)–1(b), it has only one bound state in each quantum well. Also, the energies of the first (virtual) excited states must be close to the tops of the barriers because the photon absorption strength (i.e., the probability of photoexcited transitions between states) decreases rapidly as the excited states move further above the barrier. For a given operating wavelength, these requirements can be satisfied by only one combination of well width and barrier height, eliminating any possibility of selecting detector performance by choosing different well widths and barrier compositions.

In addition, the carriers' effective mass must be low if only one bound state is allowed, thereby limiting such a QWIP to n-type dopants; this is disadvantageous because p-type dopants can lead to devices having lower dark currents. Furthermore, the conventional QWIP's spectral bandwidth can be changed over only a very small range due to fundamental properties of optical excitation of confined carriers to continuum states. As a result of these properties, changing the spectral bandwidth requires pushing the excited states deeper into the continuum, but as described above this dramatically reduces the photon absorption strength, or quantum efficiency.

A QWIP theoretically analyzed in D. Coon et al., "Narrow Band Infrared Detection in Multiquantum Well Structures", Appl. Phys. Lett. vol. 47, pp. 289–291 (Aug. 1, 1985) has a single quantum well and a barrier consisting of a superlattice. Aspects of the Coon et al. paper are described below, but it is important to note the paper admits that practical multiple-quantum-well detectors are beyond the scope of the model it describes. The superlattice barrier thicknesses and compositions described in the Coon et al. paper (superlattice periods, i.e., the distances between same-material layers, ranging from 114–94 Å) provide a very narrow miniband of states (widths ranging from 6–18 meV, respectively). In addition, the paper describes thicknesses and compositions that position the first excited state of the quantum well in the lowest energy miniband of the superlattice in order to obtain a narrow bandwidth infrared detector that would have low dark current.

The Coon et al. paper suggests that electron transport normal to the plane of the quantum well should occur fairly easily. Nevertheless as described above, a bias is necessary to transport the photoexcited carriers for collection before recombination occurs. Applying even the lowest typical bias to a detector such as that described in the Coon et al. paper would render extraction of the photogenerated carriers extremely difficult and inefficient.

As described in E. Mendez et al., "Stark Localization in GaAs-GaAlAs Superlattices under an Electric Field", Phys. Rev. Lett. vol. 60, pp. 2426–2429 (Jun. 6, 1988) and R. Leavitt et al., "Stark Ladders in Strongly Coupled Superlattices and Their Interactions with Embedded Quantum Wells", Phys. Rev. B vol. 41, pp. 5174–5177 (Mar. 15, 1990), for example, miniband states become strongly localized when the potential drop across one superlattice period is comparable to the width of the miniband. The condition for localization of the miniband states to a single superlattice well is the potential drop across one period should be equal to one-half of the miniband width. Even the lowest bias typically necessary to transport carriers out of a QWIP before recombination would completely localize the miniband states of the superlattices in the detector described in the Coon et al. paper.

As a result of such localization, transport of photoexcited carriers in the detector described in the Coon et al. paper could occur only by tunneling between the localized miniband and quantum well states. It will be appreciated that a tunneling transport process cannot be characterized as easy. Moreover, although the paper suggests that remarkably high quantum efficiencies might be achieved, in fact a detector such as that described in the paper would have a very low quantum efficiency because the probability of the carriers' transport through the detector by tunneling is significantly less than the probability of their recombination.

In addition, the Coon et al. paper describes a theoretical treatment that is valid only for miniband widths that are much smaller than the depths of the superlattice potential wells. Thus, much of the latter portion of the paper and even its title are directed to considerations arising out of the narrowband limitation. Such a narrow miniband would result in a detector having an advantageously low dark current, but would introduce other problems. The minibands described in the paper are so narrow that, as the paper acknowledges, it would be a challenge even to position the quantum wells' excited states in resonance with the minibands.

The paper's approximate solutions of Schroedinger's equation are suitable for detectors having minibands that are narrow to reduce dark current, but do not permit accurate performance prediction, i.e., selection of predetermined properties, of biased MBT detectors having wide minibands. In fact, the paper inaccurately suggests that the QWIP's absorption spectrum would have the same width as the miniband and that the absorption strength would be almost constant throughout this width. Thus, it is not surprising that the paper is silent on selectively positioning the excited states within the minibands and the consequent advantageous effects on the absorption spectrum.

SUMMARY

One object of Applicant's invention is to provide an improved semiconductor device for detecting electromagnetic, especially infrared, radiation.

It is also an object of Applicant's invention to provide a miniband transport quantum well detector that is most sensitive to a predetermined wavelength and that is sensitive to a predetermined spectral bandwidth.

It is another object of Applicant's invention to provide a miniband transport QWIP having a spectral response that is nearly constant over a broad range of wavelengths such as the atmospheric transmission windows of 3–5 $\mu$m and 8–12 $\mu$m.

It is a further object of Applicant's invention to provide a miniband transport QWIP that is sensitive to radiation in one or more than one wavelength band.

It is another object of Applicant's invention to provide a miniband transport quantum well detector having predetermined electro-optical properties, e.g., dark-current dependence on applied bias voltage and response and detectivity dependence on incident wavelength. Such properties are determined by the density, location, and type of the detector's dopants and by the thickness and composition of the detector's layers.

It is another object of Applicant's invention to provide a miniband transport quantum well detector in which the wells' excited states are selectively positioned within the miniband to improve the detector's spectral response characteristics.

These and other objects are met by a miniband transport quantum well detector comprising a substrate, a multilayer structure disposed on the substrate, and first and second contact layers disposed on the top and bottom surfaces of the multilayer structure. The multilayer structure comprises a plurality of quantum well layers interleaved with a plurality of superlattice barrier layers. Each superlattice barrier layer comprises a plurality of thin first layers having a relatively low bandgap interleaved with a plurality of thin second layers having a relatively high bandgap, and has a miniband of energy states having a center and width determined by the thicknesses and compositions of the thin first and second layers.

The thicknesses and compositions of the quantum well layers and of the thin first and second layers of the miniband transport quantum well detector are such that each quantum well has a ground state and an excited state and the energy of the excited state is substantially equal to energies of selected states within the minibands of the adjacent superlattice barrier layers. In this way, an electrically continuous channel through the multilayer structure is provided, and the detector's optical characteristics, such as the peak-response wavelength and the spectral bandwidth, are determined by an interaction of the energy states of the quantum well layers and the minibands of the superlattice barrier layers.

In accordance with one aspect of Applicant's invention, the energies of the quantum well layers' excited states may be substantially equal to the energies of a predetermined pattern of states in the minibands, thereby obtaining an MBT detector having predetermined optical characteristics.

The objects of Applicant's invention are also met by a two-color miniband transport quantum well detector comprising a substrate, a first multilayer structure disposed on the substrate, first and second contact layers disposed on the top and bottom surfaces of the first multilayer structure, a second multilayer structure disposed on the first contact layer, and a third contact layer disposed on the second multilayer structure distal from the first multilayer structure. The first multilayer structure comprises a plurality of quantum well layers interleaved with a plurality of superlattice barrier layers, the layers having thicknesses and compositions such that the detector responds to a first wavelength band. The second multilayer structure comprises a plurality of quantum well layers interleaved with a plurality of superlattice barrier layers, the layers having thicknesses and compositions such that the detector responds to a second wavelength band.

An MBT detector in accordance with Applicant's invention comprises a plurality of quantum wells that each have two bound energy states so that a wide range of materials and carrier types may be used to obtain a predetermined peak-response wavelength. In one embodiment, the MBT detector includes 78-Å-wide GaAs quantum well layers and $GaAs/Al_{0.3}Ga_{0.7}As$ superlattice barrier layers to obtain a peak-response wavelength of about 10 $\mu$m. In another embodiment, the MBT detector could include 87-Å-wide GaAs quantum well layers and $GaAs/Al_{0.4}Ga_{0.6}As$ superlattice barrier layers to obtain substantially the same peak-response wavelength. In yet another embodiment, the MBT detector includes 46-Å-wide $In_{0.15}Ga_{0.85}As$ quantum well layers and $Al_{0.3}Ga_{0.7}As/Al_{0.4}Ga_{0.6}As$ superlattice barrier layers to obtain a peak-response wavelength of about 5 $\mu$m.

Applicant's invention additionally encompasses a method for detecting electromagnetic radiation with a semiconductor device. The method includes the step of providing a plurality of quantum well layers having compositions and thicknesses such that predetermined excited state energies are obtained. The method further includes the step of providing a plurality of superlattice barrier layers interleaved with the quantum well layers. The superlattice barrier layers have wide minibands that are strongly and selectively coupled to each other and to the excited states of the quantum well layers. The method further includes the steps of exciting carriers in the quantum well layers into the excited states and minibands by photon absorption, applying an electric field across the superlattice barrier layers and the quantum well layers to transport the excited carriers through the layers, and collecting the transported carriers as a photocurrent corresponding to the number of photons absorbed.

BRIEF DESCRIPTION OF THE DRAWINGS

The invention and its objects and advantages will be understood from the following detailed description and the accompanying drawings, in which:

FIGS. 5(a) and 5(b) illustrate the energy states of a miniband transport quantum well detector in accordance with the present invention without bias and with bias, respectively;

FIG. 9(a) illustrates calculated squared wavefunctions for a miniband transport quantum well detector in which the energy of a quantum well's excited state is near the center of the miniband;

FIG. 9(b) illustrates a calculated absorption spectrum for a miniband transport QWIP in which the energies of the excited states are near the center of the miniband;

FIG. 10(a) illustrates calculated squared wavefunctions for a miniband transport quantum well detector in which the energy of a quantum well's excited state is near the top of the miniband;

FIG. 10(b) illustrates a calculated absorption spectrum for a miniband transport QWIP in which the energies of the excited states are near the top of the miniband;

FIGS. 14(a) and 14(b) illustrate measured absorption spectra for miniband transport QWIPs in which the energies of the excited states are positioned near the bottom of the miniband and in a pattern within the miniband, respectively;

DETAILED DESCRIPTION

Figure 1A:
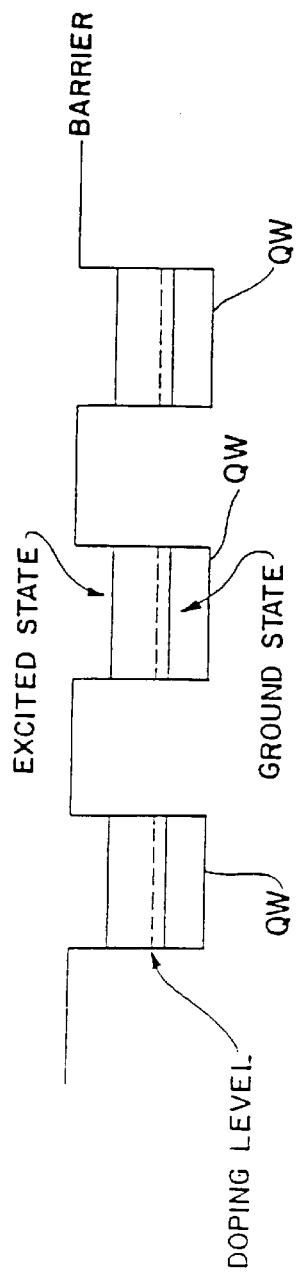
FIGS. 1(a) and 1(b) illustrate the energy states of a conventional QWIP without bias and with bias, respectively.

As described in more detail below, Applicant's semiconductor electromagnetic detector comprises a plurality of doped quantum well layers separated by finite-period superlattice barrier layers. In accordance with Applicant's invention, the superlattice barrier layers have minibands of energy states that are electrically and optically coupled to states of the quantum wells. Thus, the superlattice barrier layers contribute substantially to the optical characteristics (e.g., the peak-response wavelength and the spectral bandwidth) of the detector. Both the peak-response wavelength and the spectral bandwidth of the detector are determined by the thicknesses and compositions of the layers. The thicknesses and compositions can be chosen from a wide range of possible values to obtain predetermined peak-response wavelengths.

In accordance with Applicant's invention, the finite-period superlattice layers form actual barriers to carriers in the ground states of the quantum well layers. Using superlattices as barriers permits more adjustability and control of detector characteristics than is possible with previous structures such as those described in the above-cited papers by Levine et al. The number of periods in the finite-period superlattices is chosen sufficiently large that dark current due to tunneling out of the wells' ground states is substantially eliminated.

Also, the thicknesses and compositions of the thin layers of the superlattice barrier layers are selected such that the layers have minibands that strongly interact, or merge, with the quantum well layers' excited states. Moreover, the widths of the minibands of the superlattice barrier layers are much larger than the drop in potential across a period of the superlattice when the detector is biased. As described in the above-cited Mendez et al. and Leavitt et al. papers, this ensures that the minibands do not break up into series of strongly localized states and the minibands remain strongly coupled to each other. Thus, an electrically continuous channel through the detector is provided despite the interruption of the superlattices by the quantum well layers, which would otherwise impede the transport of photoexcited carriers. A carrier photoexcited into a well's excited state (or a miniband state) can be transported easily under the influence of the applied bias through the detector and be collected at suitable contacts as photocurrent.

It will be appreciated a detector in accordance with Applicant's invention is thus significantly different from previous detectors such as that described in the above-cited Coon et al. paper. Detectors in accordance with Applicant's invention have miniband widths typically ranging from 50–120 meV and superlattice periods of 60–40 Å, respectively, and thus localization effects are significant only for very high internal electric fields (40–150 kV/cm, respectively). In contrast, the Coon et al. paper discloses superlattice layer thicknesses and compositions that yield a very narrow (6–18 meV) miniband in order to obtain a narrow bandwidth infrared detector. Such superlattices would collapse into completely localized states for the 10–30 kV/cm internal electric fields that are needed for extraction of photogenerated carriers. It will therefore be appreciated that the extraction of photoexcited carriers from the Coon et al. detector would be extremely inefficient.

In addition, the Coon et al. paper does not suggest that the detector's response is partially determined by the relation between the wells' excited states' energies and the energies of states in the minibands. As described above, the paper's theoretical treatment is valid only for miniband widths that are much smaller than the depths of the superlattice potential wells, and leads to an absorption spectrum that has the same width as the miniband and is substantially constant throughout that width. It will be appreciated that the approximations used in the paper should not be extrapolated to wide minibands. As described in more detail below, exact solutions (i.e., solutions valid for all miniband widths) to the Schrodinger equation for detectors in accordance with Applicant's invention show the excited state's position relative to the miniband has a profound effect on the absorption spectrum.

Figure 3:
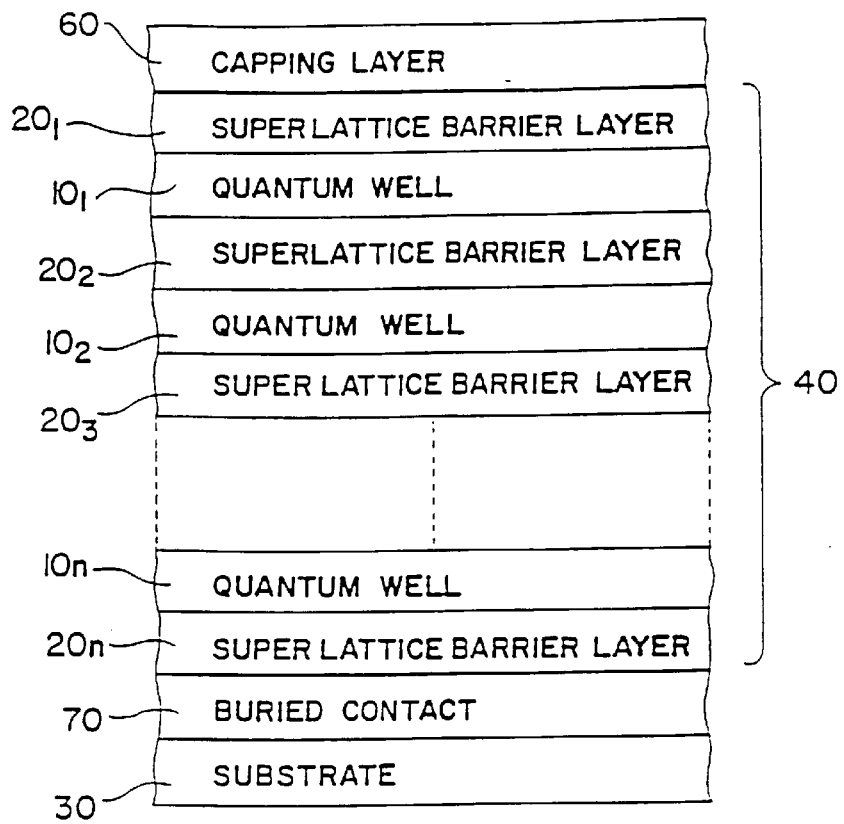
FIG. 3 illustrates part of the semiconductor structure of a miniband transport quantum well detector in accordance with the present invention.

FIG. 3 illustrates part of the semiconductor structure of a miniband transport (MBT) quantum well detector in accordance with Applicant's invention. The MBT detector comprises a plurality of quantum well layers $10_1$–$10_n$ interleaved between a plurality of superlattice barrier layers $20_1$–$20_n$. The interleaved layers are disposed on a substrate 30 and are a multilayer structure denoted by the reference numeral 40. A capping layer 60 and a buried contact 70 are provided on each end of the multilayer structure 40.

Figure 4:
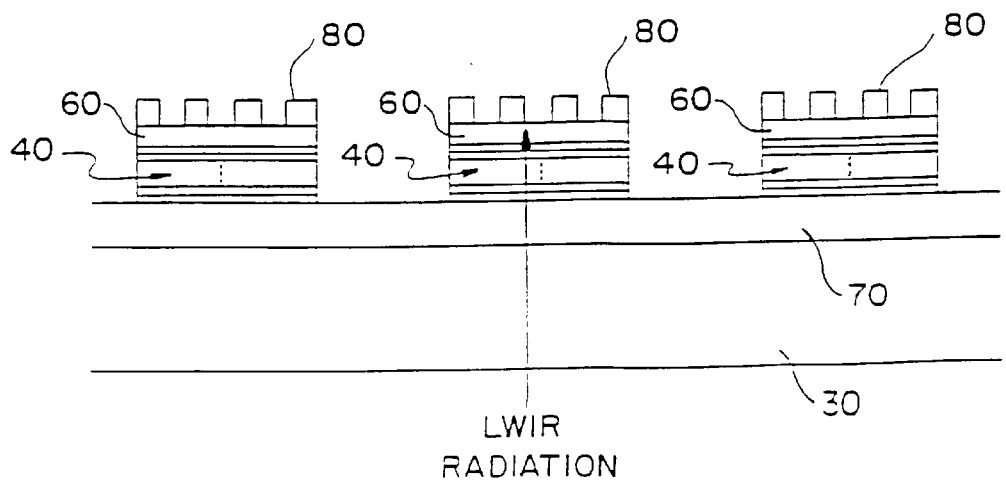
FIG. 4 illustrates a cross-section of a miniband transport QWIP having the semiconductor structure shown in FIG. 3.

FIG. 4 is a cross-section of a plurality of MBT detectors that are arranged as pixels in an array for detecting LWIR radiation that is incident through the substrate. (Only three MBT detectors are shown in the figure, but it will be appreciated that the array may comprise a larger number of pixels.) Each pixel is delineated and its buried contact 70 exposed by suitably etching away the material surrounding the pixels.

As illustrated in FIG. 4, each pixel advantageously includes an optical diffraction grating 80 that may be etched into the capping layer 60 and that may have a metal contact deposited on its upper surface. It will be appreciated that light incident through the substrate 30 is not detected as it passes through the multilayer structure 40. The gratings, which have dimensions and efficiencies appropriate for the wavelengths to be detected, produce a diffracted component of the incident light that is polarized perpendicular to the detectors' layers and that is detected. It will be understood that such a polarization is required by the selection rules governing the absorption of infrared light in quantum wells, as described in, e.g., L. West et al., "First Observation of an Extremely Large-Dipole Infrared Transition within the Conduction Band of a GaAs Quantum Well", Appl. Phys. Lett. vol. 46, pp. 1156–1158 (Jun. 15, 1985), which is incorporated here by reference. Thus, the gratings facilitate fabrication of two-dimensional arrays of MBT detectors. The upper-surface metallization is advantageous because it permits mass electrical connection to the detectors in an array by a technique such as indium-bump bonding.

Instead of or in addition to the gratings 80, any of the various known techniques for increasing the proportion of the incident light that may be detected may be used with Applicant's MBT detectors. For example, the grating lines may be etched into the surface of the substrate 30 if the imaging properties of the array are not important. The photons diffracted through the detectors may then be reflected by metallic capping layers 60, and the reflected photons would have another chance at absorption in the array pixels. Also, two-dimensional gratings might be used, although such gratings would have some effect on efficiency.

In accordance with one aspect of Applicant's invention, each of the quantum wells formed in layers $10_1$–$10_n$ contains a ground state and an excited state. In addition, each of the superlattice barrier layers $20_1$–$20_n$ is comprised of a plurality of thin, lower-bandgap layers (quantum wells) separated by thin, higher-bandgap layers (barriers). As described above, the superlattice layers' thicknesses and compositions are chosen so that the energy states of the thin quantum wells merge to form a wide (approximately 50–150 meV) miniband of energy states that is in resonance with the excited states of the quantum well layers $10_1$–$10_n$.

As used in the current application, "resonance" between a superlattice barrier's miniband and a quantum well's excited state means that the energy of the well's excited state is either slightly below the miniband's lowest energy (viz., at the "bottom" of the miniband), between the miniband's lowest and the highest energies, or slightly above the miniband's highest energy (viz., at the "top" of the miniband). This relationship is also referred to below as one in which the excited state is positioned within the miniband because the miniband of a finite-period superlattice barrier does not disappear completely outside the barrier but continues into the adjacent quantum wells. If the quantum well's excited state is positioned below the bottom or above the top of the miniband, it is believed that such an excited state's energy should be, as a practical matter, within 5–10 meV of the miniband's top or bottom in order to maintain coupling between the excited state and the miniband. For excited states further away from the miniband, the carriers would have to tunnel into the miniband.

An example of the energy states of an unbiased MBT detector in accordance with Applicant's invention is illustrated in FIG. 5(a), which shows the excited states of the quantum wells QW-$10_2$, QW-$10_3$ falling between the top and bottom of a miniband 100 formed by the superlattice barrier layers $20_1$–$20_3$ comprised of thin barrier layers 110 and thin well layers 120. The quantum well layers $10_2$, $10_3$ are preferably doped so that the wells' ground states are partially filled with carriers (signified by the dotted lines in the wells QW-$10_2$, QW-$10_3$).

FIG. 5(b) illustrates the effect on the energy states of an electric field applied to the structure: the miniband 100 is tilted. The carriers in the ground states of the quantum wells may thus be lifted into the wells' excited states or the miniband states by the absorption of suitably energetic photons (three are shown in the figure). With the wells' excited states in resonance with the superlattice barriers' minibands, the minibands remain strongly coupled to each other and the probability of photoinduced transitions into miniband states is increased. In this way, the carriers can move with relative ease under the influence of the applied bias through the layers $10_1$–$10_n$, $20_1$–$20_n$ for collection at the contact layer 70 as a photocurrent.

Figure 1B:
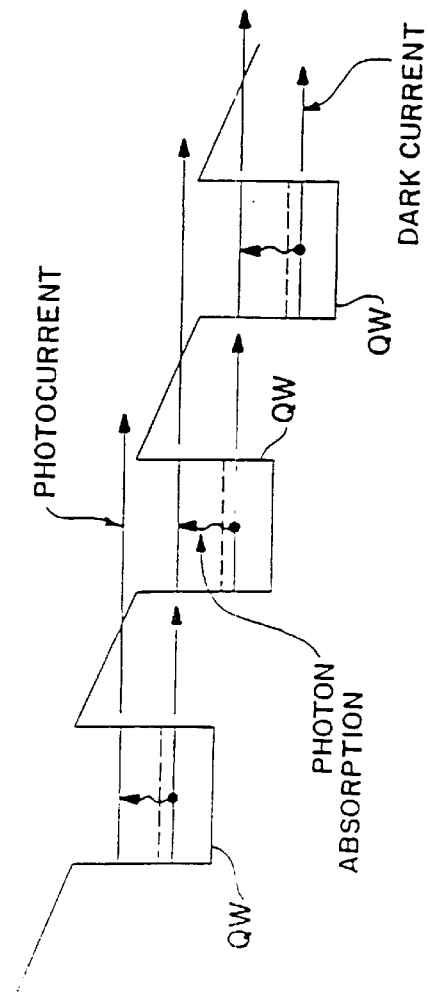
Figure 2A:
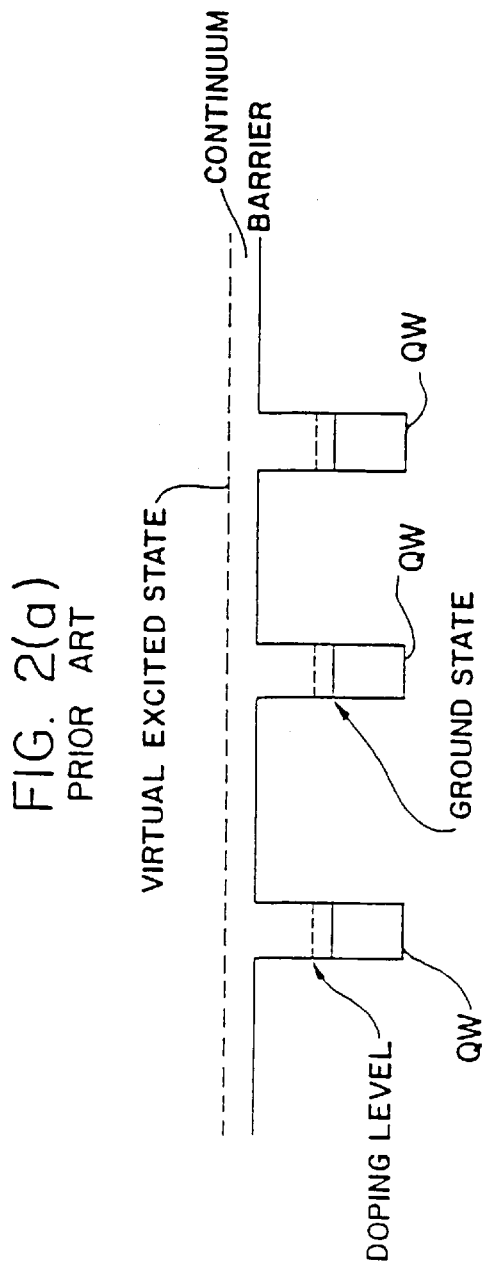
FIGS. 2(a) and 2(b) illustrate the energy states of another conventional QWIP without bias and with bias, respectively.
Figure 2B:
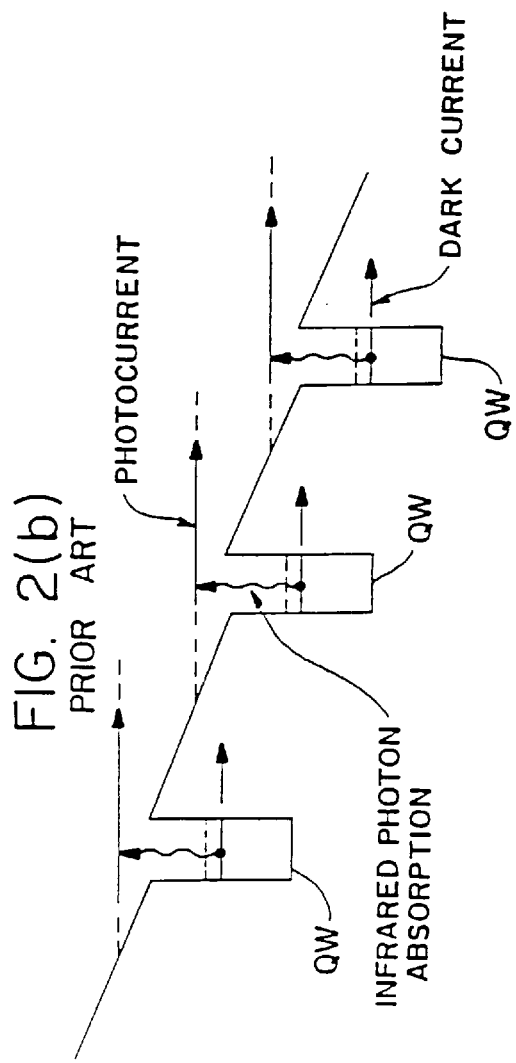

The superlattice barrier layers $20_1$–$20_n$ are preferably of such a thickness that the probability of carriers tunneling directly from one quantum well's ground state into the states in the adjacent well, the miniband, or the continuum is substantially zero for the biases typically applied to the structure. In other words, the tunneling component of the dark current is approximately zero for Applicant's MBT detector, which is in sharp contrast to the conventional QWIP behavior illustrated in FIG. 1(b).

Also, the heights of the thin barrier layers of the superlattice barrier layers $20_1$–$20_n$ are preferably such that the probability of thermionic emission of carriers into states above the barriers (i.e., states in the continuum) is substantially zero for the MBT detector's operating temperature. MBT detectors suitable for the MWIR and LWIR bands would typically operate at about 77 K. Under these conditions, the MBT detector's dark current results from thermionic emission of carriers into the miniband, and therefore depends on the difference in energy between the wells' ground states and the bottom of the miniband.

An MBT detector in accordance with Applicant's invention has been made by molecular-beam epitaxy on a GaAs substrate. The MBT detector includes forty GaAs quantum well layers, each of which is 78 Å thick and is doped with silicon to a concentration of $4\times10^{17}$ cm$^{-3}$. The quantum well layers are separated by superlattice barrier layers in the manner illustrated in FIG. 3; each superlattice barrier layer is comprised of nine thin GaAs wells, each approximately 20 Å thick, and ten thin $Al_{0.3}Ga_{0.7}As$ barriers, each approximately 40 Å thick. The MBT detector had 1-$\mu$m-thick capping and buried contact layers made of heavily doped GaAs formed above and below the active quantum well layers.

Such compositions and thicknesses of the quantum well and superlattice barrier layers yield an MBT detector having a miniband width of about 50 meV, the wells' excited states at the bottom of the miniband, and an energy difference between the wells' ground and excited states of approximately 118 meV. That energy difference corresponds to a peak-response wavelength of about 10.5 $\mu$m. Calculations have shown that an MBT detector having 87-Å-thick GaAs quantum well layers and GaAs/$Al_{0.4}Ga_{0.6}As$ superlattice barrier layers would have substantially the same optical properties. Thus, Applicant's invention provides for fabricating from a variety of compositions and thicknesses MBT detectors having similar properties.

In an arrangement similar to that illustrated in FIG. 4, a plurality of such MBT detectors having various areas were then defined on the substrate by chemical etching. It will be appreciated that the upper limit on detector size (detectors as large as 500 $\mu$m have been built) is usually determined by the acceptable dark current, which is proportional to area, and to a lesser extent by defects produced during fabrication. The lower limit on detector size (about 1 $\mu$m for MBT detectors, which are typically about 2–4 $\mu$m thick) is mainly determined by the etching and lithography processes used. Instead of having gratings disposed at the capping layers 60 as shown in FIG. 4, however, triangular gratings having a 4-$\mu$m-pitch were etched into the substrate 30 so that light polarized perpendicular to the quantum well layers was incident on the pixels. Also, ohmic metal contacts were deposited on the capping and (now partially exposed) buried contact layers.

Figure 6:
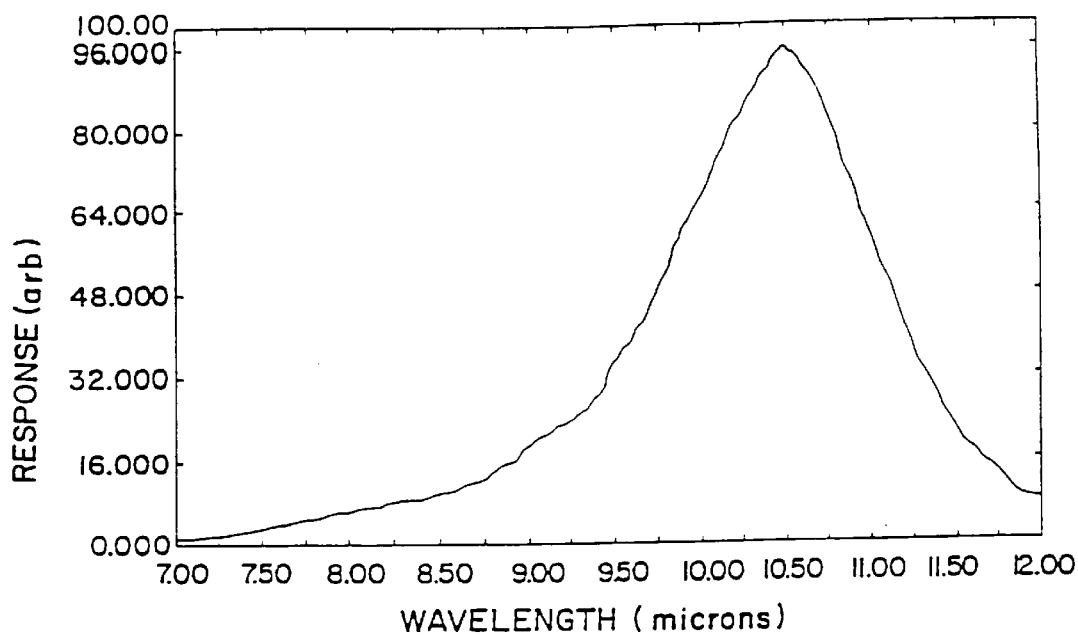
FIG. 6 shows a measured photocurrent response spectrum of a miniband transport QWIP in which the energies of the excited states of the quantum wells are near the bottom of the miniband.
Figure 7:
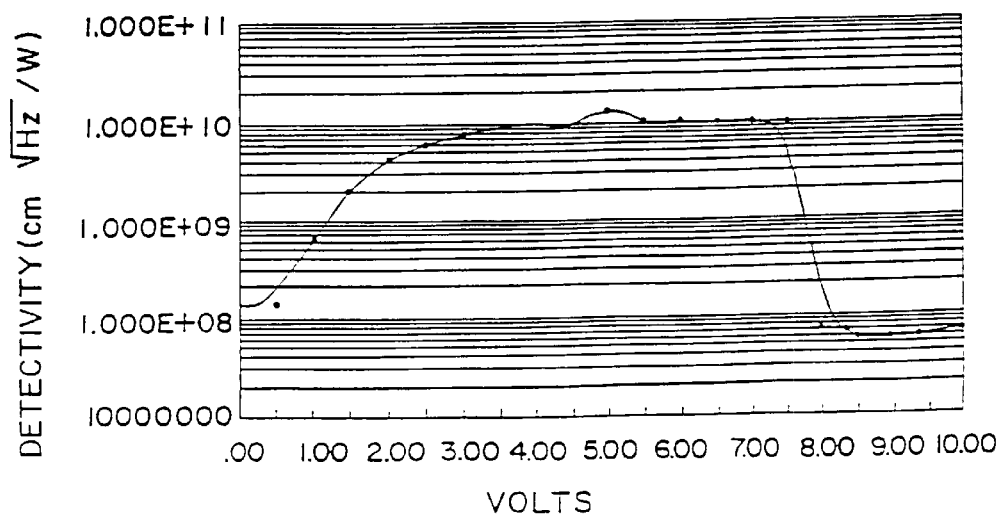
FIG. 7 shows the measured bias dependence of the detectivity of the miniband transport QWIP of FIG. 6.

FIGS. 6 and 7 illustrate measured characteristics of one of the MBT detectors. FIG. 6, which shows the relationship between incident wavelength and MBT detector response (in arbitrary units of photocurrent), indicates a peak-response wavelength of about 10.5 $\mu$m and a long-wavelength cutoff (the half-peak point) of about 11.1 $\mu$m. FIG. 7, which shows the relationship between applied bias voltage and detectivity at a detector operating temperature of 77 K, indicates the tested MBT detector has a peak D*=$1\times10^{10}$ cm Hz$^{1/2}$W$^{-1}$.

It will be appreciated that MBT detectors and arrays can be made that have other layer compositions and thicknesses. In particular, the energies of the excited states and the miniband states can be chosen to obtain desired optical and electrical characteristics, and the layer compositions and thicknesses can be chosen from a wide range of possible materials and values. In general, MBT detectors in accordance with Applicant's invention can be made from any materials suitable for making quantum wells, e.g., aluminum gallium arsenide, pseudomorphically strained indium gallium arsenide on gallium arsenide substrates, and lattice-matched indium gallium arsenide on indium phosphide substrates. In addition, it will be appreciated that such intersubband detectors on GaAs are currently most useful for wavelengths between about 3 $\mu$m and about 19 $\mu$m. Moreover, the doping, which leads to the desired light absorption in the quantum well layers, may be varied in concentration, and possibly in position as well (i.e., the detectors may be made with modulation doping of the superlattice barrier layers).

It will be understood that the doping level determines the strength of photon absorption, which is directly proportional to the two-dimensional doping density. On the other hand, as the doping level increases, the fermi level of the ground state gets closer to the bottom of the miniband, increasing thermionic emission into the miniband and thus the dark current. In general, it is believed that doping levels in the range of about $1 \times 10^{17}$ cm$^{-3}$ to $2 \times 10^{18}$ cm$^{-3}$ are suitable for the MBT detectors described in this application. It will be appreciated that for MBT detectors responsive to the MWIR band the doping levels can be higher than they are for LWIR MBT detectors, viz., closer to $10^{18}$ cm$^{-3}$, because the energy separation of the ground state and the excited and miniband states is greater. Also, lower operating temperatures would typically permit higher doping levels without increased dark current as described below.

Exact Airy function solutions of Schroedinger's equation, including an applied field, are preferably used to determine the energies and wavefunctions of carriers in the quantum wells and the superlattice barriers of the MBT detector. See, e.g., C. Weisbuch et al., *Quantum Semiconductor Structures*, pp. 19–20, Academic Press (1991) and M. Abramowitz et al., eds., *Handbook of Mathematical Functions*, Applied Mathematics Series 55, pp. 446–455, National Bureau of Standards, Washington, D.C. (June 1964), which are incorporated here by reference. In general, such solutions are sums of Airy functions with boundary conditions imposed by the detector structure that lead to discrete energy solutions and specific carrier wavefunctions. (It will be appreciated that the square of the wavefunction gives the probability of finding the carrier at positions in the detector.) The probability of photon absorption is determined from the square of the dipole matrix element that depends on the overlap integral of the product of the final state wavefunction and the derivative of the ground state wavefunction. The final state can be the excited state of one of the quantum wells $10_1$–$10_n$ or any of the miniband states of the superlattice barriers $20_1$–$20_n$.

From such exact solutions of Schroedinger's equation, the MBT detector's characteristics can be predicted accurately and precisely tailored. Approximate solutions, such as those described in the above-cited Coon et al. paper, do not permit accurate performance prediction, i.e., selection of predetermined properties, of biased MBT detectors having wide minibands, although such approximations are suitable for detectors having minibands that are narrow to reduce dark current. Based on such exact solutions, FIGS. 8(*a*)–10(*b*) illustrate the effect of the relationship between the energies of the excited state and the miniband states on the optical characteristics of an MBT detector.

Figure 8A:
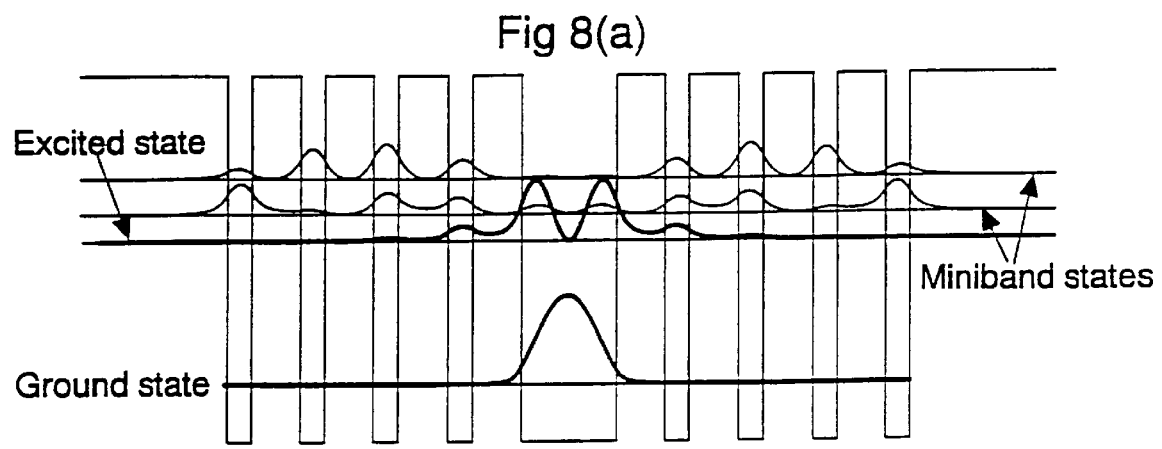
FIG. 8(a) illustrates calculated squared wavefunctions for a miniband transport quantum well detector in which the energy of a quantum well's excited state is near the bottom of the miniband.
Figure 8B:
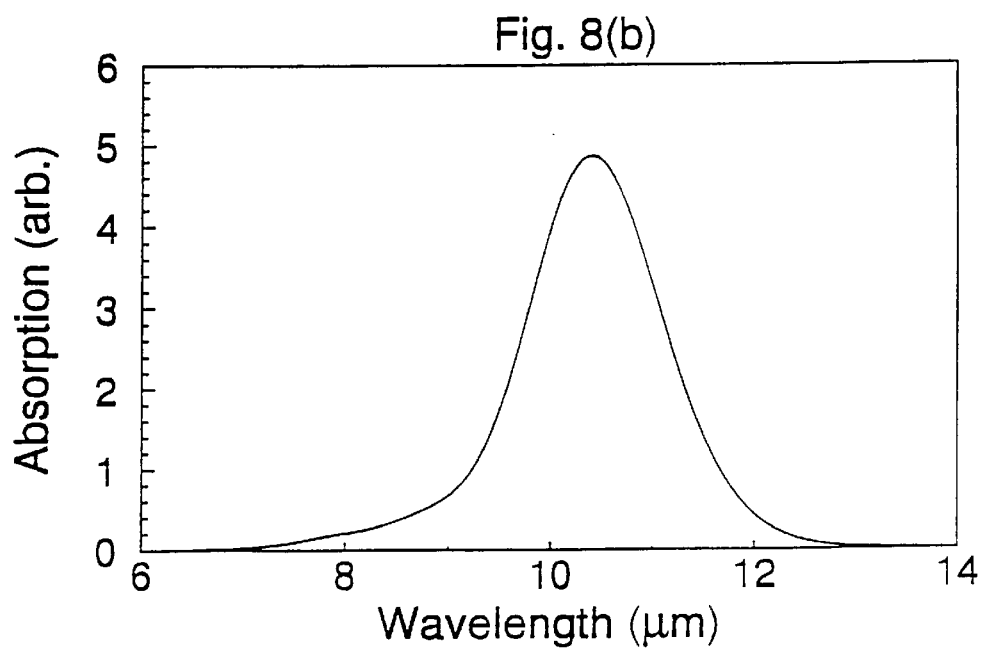
FIG. 8(b) illustrates a calculated absorption spectrum for a miniband transport QWIP in which the energies of the excited states are near the bottom of the miniband.

FIG. 8(*a*) illustrates calculated squared wavefunctions for carriers in a well's ground and excited states and selected miniband states of an MBT detector having layer compositions and thicknesses chosen such that the excited state's energy is near the bottom of the miniband. As shown, the magnitudes of the squared wavefunctions of carriers in the miniband states in the vicinity of the central quantum well are largest for states having energies nearest that of the excited state and decrease for states having higher energies. As described above, this interaction of the well's excited state with the miniband states significantly contributes to the electro-optical properties of Applicant's MBT detector.

FIG. 8(*b*) illustrates the calculated absorption spectrum for the MBT detector yielding the wavefunctions shown in FIG. 8(*a*). The absorption spectrum can be determined in a straightforward way from the calculated probabilities of photon absorption, and is proportional, but not usually identical, to the photocurrent response spectrum. The absorption spectrum is mainly determined by the photoinduced transition from the ground state to the excited state near the bottom of the miniband. Nevertheless, it will be noted that the absorption spectrum also has a short-wavelength (high-energy) tail that is due to photoinduced transitions from the ground state into higher-energy miniband states. The fact that the calculated absorption spectrum shown in FIG. 8(*b*) is similar to the measured absorption spectrum shown in FIG. 6 confirms that the fabricated and measured MBT detector had the excited state's energy near the bottom of the miniband.

FIG. 9(*a*) illustrates calculated squared wavefunctions for carriers in a well's ground and excited states and selected miniband states of an MBT detector having layer compositions and thicknesses chosen such that the excited state's energy is near the center of the miniband. As shown, the magnitudes of the squared wavefunctions of carriers in the miniband states in the vicinity of the quantum well are largest for states having energies nearest that of the excited state and decrease for states having higher or lower energies. It will be noted that the squared wavefunction magnitudes of carriers in states at the top and bottom of the miniband are still substantial in the vicinity of the quantum well.

FIG. 9(*b*) illustrates the calculated absorption spectrum for the MBT detector yielding the wavefunctions shown in FIG. 9(*a*). The absorption spectrum is broad because the probabilities of photoinduced transitions from the well's ground state into the excited state and the miniband states are all substantial as indicated in FIG. 9(*a*).

FIG. 10(*a*) illustrates calculated squared wavefunctions for carriers in a well's ground and excited states and selected miniband states of an MBT detector having layer compositions and thicknesses chosen such that the excited state's energy is near the top of the miniband. As shown, the magnitudes of the squared wavefunctions of carriers in the miniband states in the vicinity of the quantum well are largest for states having energies nearest that of the excited state and decrease for states having lower energies.

FIG. 10(*b*) illustrates the calculated absorption spectrum for the MBT detector yielding the wavefunctions shown in FIG. 10(*a*). The absorption spectrum is mainly determined by the photoinduced transition from the ground state to the excited state near the top of the miniband. It will be noted that the absorption spectrum also has a long-wavelength (low-energy) tail that is due to photoinduced transitions from the ground state into lower-energy miniband states.

Similar calculations have been performed for structures in which the energies of the excited states are substantially different from any of the miniband state energies (viz., structures in which the excited states are not in resonance with, or positioned within, the miniband). The calculations show that the magnitudes of the squared wavefunctions of carriers in the miniband states are substantially zero in the vicinity of the quantum well. Thus, the minibands of the superlattice barrier layers would not be strongly coupled to one another other, and reflection of carriers at each superlattice-barrier-layer/quantum-well-layer interface would be substantial, thereby greatly impeding carrier transport through the structure.

Using exact solutions of Schroedinger's equation, FIGS. 8(*a*)–10(*b*) illustrate that an MBT detector's absorption spectrum and the miniband carrier wavefunctions can be substantially modified by selectively positioning the energy of the excited state within the miniband. The calculations illustrated in these figures have been verified by measurements performed on fabricated MBT detectors.

Figure 11A:
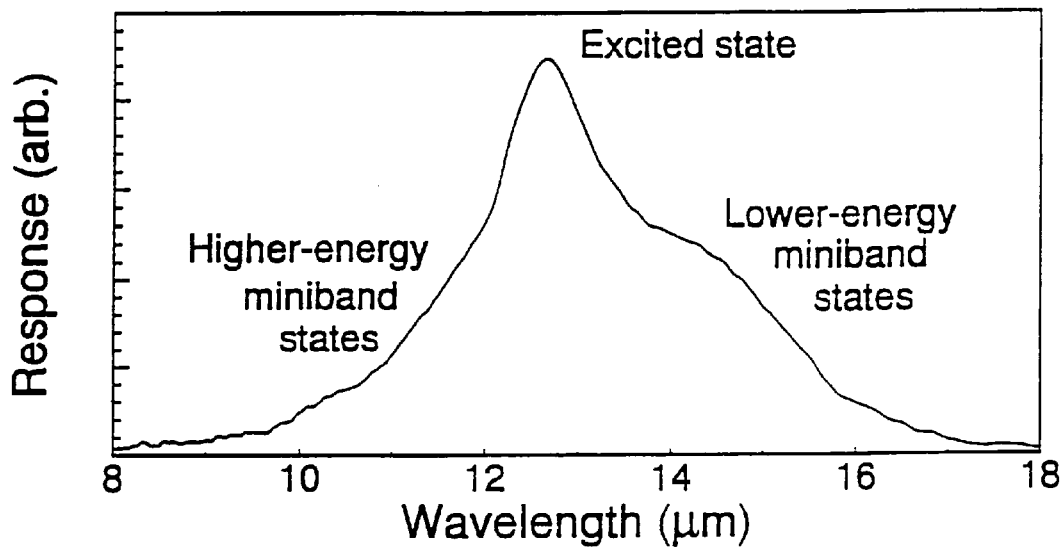
FIGS. 11(a) and 11(b) illustrate measured photocurrent response spectra of miniband transport QWIPs in accordance with the present invention.

FIG. 11(*a*) shows a measured photocurrent response spectrum (in arbitrary units of photocurrent) of an MBT detector in which the energies of the excited states are near the center of the miniband. The measured peak-response wavelength, which is due mainly to the photoinduced transitions to the excited states, was close to 13 μm. As described above in connection with FIG. 9(b), the short-wavelength tail is due to transitions to the higher-energy miniband states, and the long-wavelength tail is due to transitions to the lower-energy miniband states. The MBT detector had forty 100-Å-thick GaAs quantum well layers doped with silicon to a concentration of $4 \times 10^{17}$ cm$^{-3}$ and superlattice barrier layers each having fourteen 24-Å-thick GaAs wells and fifteen 20-Å-thick $Al_{0.3}Ga_{0.7}As$ barriers.

Figure 11B:
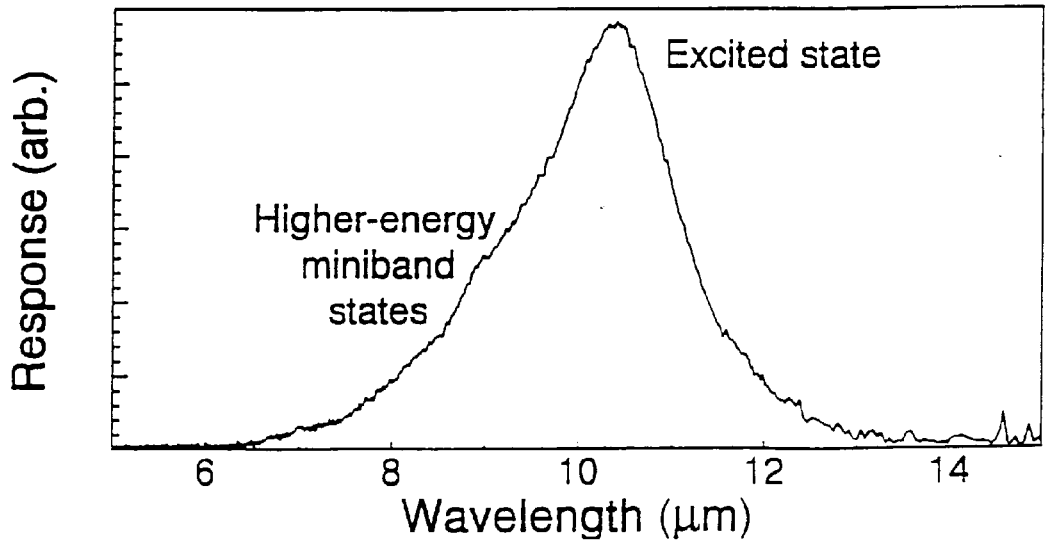

FIG. 11(b) shows a measured photocurrent response spectrum (in arbitrary units of photocurrent) of an MBT detector having 78-Å-thick quantum well layers and the energies of the excited states positioned near the bottom of the miniband like the detector illustrated in FIG. 6. The measured peak-response wavelength, which is due mainly to the photoinduced transitions to the excited states, was close to 10 μm. As described above in connection with FIGS. 6 and 8(b), the short-wavelength tail is due to transitions to the higher-energy miniband states, and such a photocurrent response spectrum could be produced by a variety of layer compositions and thicknesses.

Figure 12A:
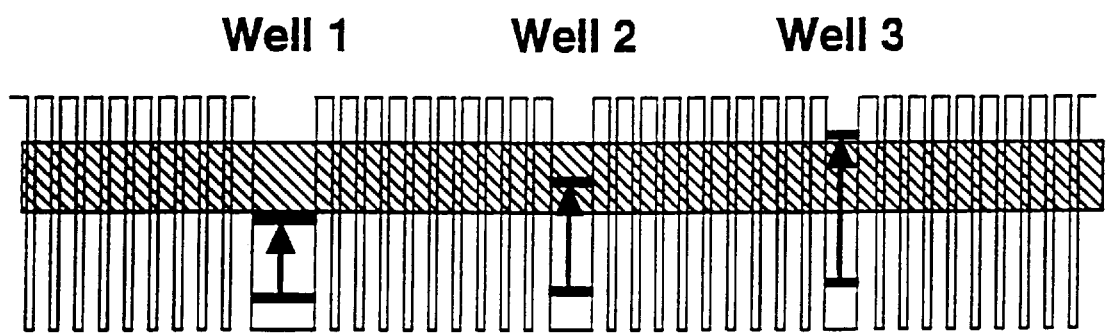
FIG. 12(a) illustrates the energy states of a broad-band miniband transport quantum well detector in which the energies of the excited states are positioned in a pattern within the miniband.

In accordance with another aspect of Applicant's invention, the widths of the quantum well layers can be chosen such that energies of excited states are positioned within the miniband in a pattern, e.g., with states near the bottom, center, and top of the miniband. FIG. 12(a) illustrates the energy states of such an MBT detector in which all of the superlattice barrier layers are the same and the widths of the quantum wells are varied. As shown in the figure, the excited states' energies of three quantum wells are positioned near the bottom (well 1), center (well 2), and top (well 3) of the miniband. It will be appreciated that such a three-well pattern would usually be repeated many times to form the MBT detector.

Figure 12B:
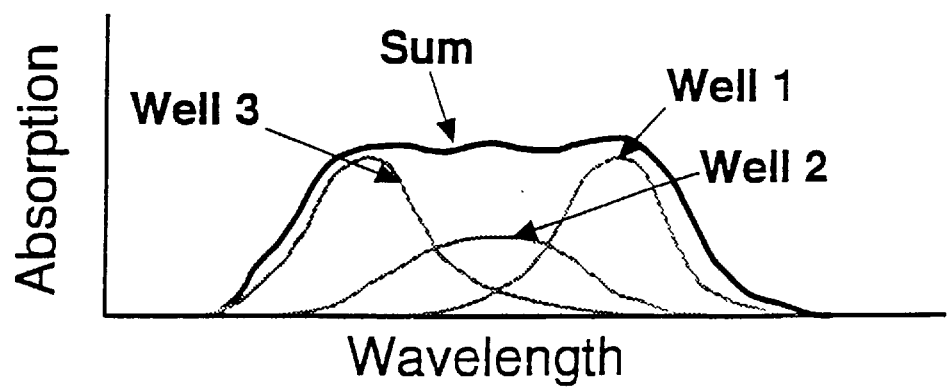
FIG. 12(b) illustrates an absorption spectrum of the broad-band miniband transport quantum well detector of FIG. 12(a)

FIG. 12(b) illustrates the calculated absorption spectrum of an MBT detector having the energies of the excited states positioned in such a pattern within the miniband. The total spectrum of the detector is a sum of the absorption spectra of the wells 1–3 (shown as half-tone lines in the figure), and advantageously spans a broad band of wavelengths with nearly constant response over the band. In contrast, it will be appreciated that, in a conventional QWIP having a virtual excited state above the barrier, the absorption strength falls off monotonically as the width of the well is decreased (i.e., as the transition energy is increased). Thus, the strong, short-wavelength absorption required for the broad-band response shown in FIG. 12(b) can only be obtained in a conventional QWIP by varying the composition of each of the barrier layers, thereby making detector fabrication significantly more difficult.

Figure 13:
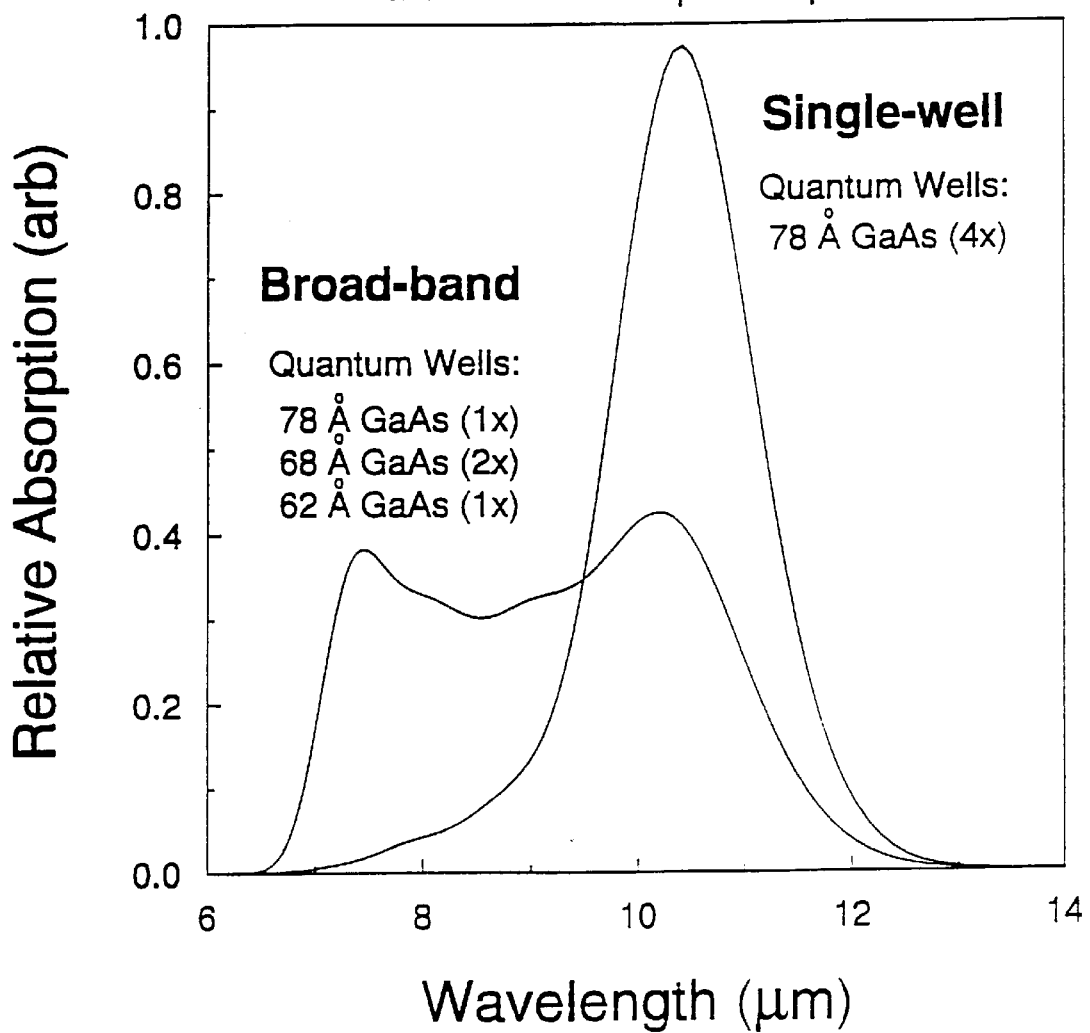
FIG. 13 illustrates calculated relative absorption spectra for miniband transport QWIPs in accordance with the present invention.

FIG. 13 presents a comparison of two MBT detectors that both have the same total number of quantum well layers, but the layers of one detector all have the same width and the layers of the other have widths such that their excited states are positioned in a pattern in the minibands. FIG. 13 illustrates a calculated absorption spectrum of an MBT detector having four (or an integer multiple of four) GaAs quantum well layers, all of which have the same 78 Å width. Such a single width positions the wells' excited states near the bottom of the miniband formed by the above-described superlattice barrier layers. Also shown in FIG. 13 is a calculated absorption spectrum of a broad-band MBT detector having four (or an integer multiple of four) GaAs quantum well layers of differing widths. One (or one-fourth of the total) of the quantum wells is 78 Å wide, positioning the excited state near the bottom of the miniband. Another two (or two-fourths of the total) of the wells are each 68 Å wide, positioning the excited state near the center of the miniband. The remaining well (or one-fourth of the total) is 62 Å wide, positioning the excited state near the top of the miniband.

As seen from FIG. 13, the two spectra represent the same integrated absorption strength, but the response of the broad-band detector is nearly constant over a wavelength band that is much larger than that of the single-well-width detector. Such a broad-band, uniform-response detector would be desirable as elements of imaging arrays because such arrays would have less variation in response due to variations in layer thickness and material composition over the area of the array.

It will be appreciated that the solutions to Schroedinger's equation do not depend on the layers' total number, which is limited mainly by the fabrication processes used and the relation between the times for carrier recombination and transport out of the detector. In addition, the order of the widths generally does not affect performance, although disposing the low-energy layers "downhill" in the applied bias field might affect the dark current.

On the other hand, the broad-band detector's response is determined by the relative numbers of thick, thicker, and thickest layers. As shown in FIG. 13, twice as many 68-Å-wide layers, which contribute a broader component of the detector's response due to the positioning of the excited states in the middle of the miniband, are provided to compensate for those layers' relatively lower response and to obtain a uniform-response detector. Thus, in accordance with an aspect of Applicant's invention, the numbers of layers, as well as the layers' compositions and thicknesses, can be selected to obtain an MBT detector having predetermined properties.

FIGS. 14(a)–14(b) show experimental verification of the calculated spectra illustrated in FIG. 13. FIG. 14(a) shows a measured absorption spectrum of an MBT detector having forty 78-Å-wide quantum well layers and having the wells' excited states positioned near the bottom of the miniband. FIG. 14(b) shows a measured absorption spectrum of a broad-band MBT detector having ten 78-Å-wide quantum wells, twenty 68-Å-wide quantum wells, and ten 62-Å-wide quantum wells. The detectors that yielded the measured spectra shown in FIGS. 14(a)–14(b) had superlattice barrier layers formed of thin alternating layers of GaAs (20 Å) and $Al_{0.3}Ga_{0.7}As$ (40 Å). The figures demonstrate that, in accordance with Applicant's invention, an exact approach to Schroedinger's equation can be used to create a pattern of quantum well excited state energies positioned in a superlattice barrier miniband and obtain a broad-band, uniform-response QWIP.

It can be noted that FIGS. 14(a)–14(b) also experimentally verify the calculated performance of an MBT detector in which the excited states are positioned near the top of the miniband. In such a detector, carriers in the ground state can be more readily thermally excited into the miniband states, and a greater dark current typically would result. The same is generally true for MBT detectors having wide minibands, which is in contrast to a narrow-miniband detector like the one described in the Coon et al. paper that would have advantageously low dark current (but also low photocurrent). Nevertheless, increasing the miniband width in an MBT detector in which the well's excited state is positioned near the bottom of the miniband does not result in a significant increase in dark current at an operating temperature of 77 K because the carrier density decreases exponentially as the energy increases. Thus, the bottom of the miniband is a major factor in determining the dark current.

The thermal-excitation component of the dark current can be reduced by reducing the detector's operating temperature below 77 K, but this is usually disadvantageous except in special environments such as space-based systems. Moreover, reducing the thermal-excitation component of the dark current by lowering the operating temperature makes the component of the dark current due to tunneling through the superlattice barrier layers relatively more important. As described above, the tunneling component can be reduced by making the superlattice barrier layers thicker, but this increases the chances that the carriers may lose too much energy and recombine before they are transported out of the detector.

Figure 15A:
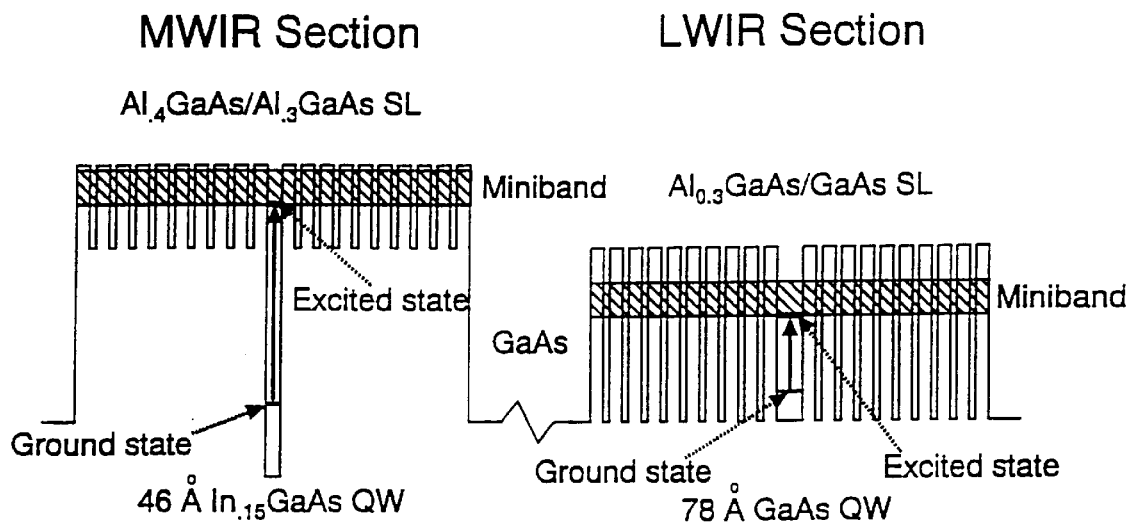
FIG. 15(a) illustrates the energy states of a two-color miniband transport quantum well detector in accordance with the present invention.

In accordance with another aspect of Applicant's invention, a two-color MBT detector may include two MBT detector sections in which the compositions and layer thicknesses of one section are selected such that the section's peak-response wavelength falls in a first wavelength band and the composition and layer thicknesses of the other section are selected such that the peak-response wavelength falls in a second wavelength band. FIG. 15(a) illustrates the energy states and layer compositions and thicknesses for such a two-color MBT detector.

When the first MBT detector section has 46-Å-wide quantum well layers of $In_{0.15}Ga_{0.85}As$ interleaved with superlattice barrier layers formed of thin alternating layers of $Al_{0.4}Ga_{0.6}As$ and $Al_{0.3}Ga_{0.7}As$, the first wavelength band is in the MWIR atmospheric transmission window. When the second MBT detector section has 78-Å-wide quantum well layers of GaAs interleaved with superlattice barrier layers formed of thin alternating layers of $Al_{0.3}Ga_{0.7}As$ and GaAs, the second wavelength band is in the LWIR atmospheric transmission window. The LWIR detector section could be disposed either atop or below the MWIR detector section on the substrate. The sections, which would have the structures generally illustrated in FIG. 3, would be separated by a suitably doped GaAs contact layer, thereby providing for independent section biasing and readout.

Figure 15B:
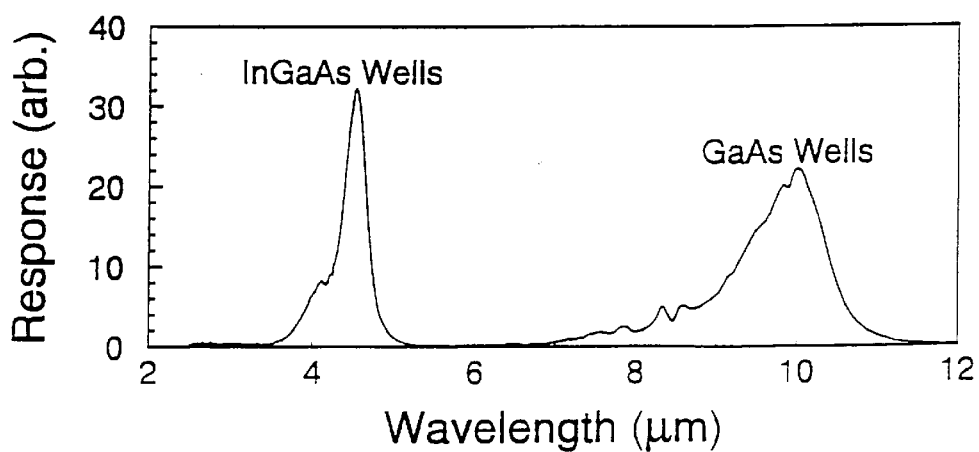
FIG. 15(b) shows a measured photocurrent response spectrum for a two-color miniband transport QWIP in accordance with the present invention.

FIG. 15(b) shows a measured photocurrent response spectrum of a two-color MBT detector comprising forty periods of the MWIR section having quantum well layers doped to a concentration of $1\times10^{18}$ cm$^{-3}$ and forty periods of the LWIR section having quantum well layers doped to a concentration $4\times10^{17}$ cm$^{-3}$ described above in connection with FIG. 15(a). The figure indicates that an array of MBT detectors can be fabricated in which photoresponse in two distinct wavelength bands is obtained simultaneously from each pixel.

Figure 16:
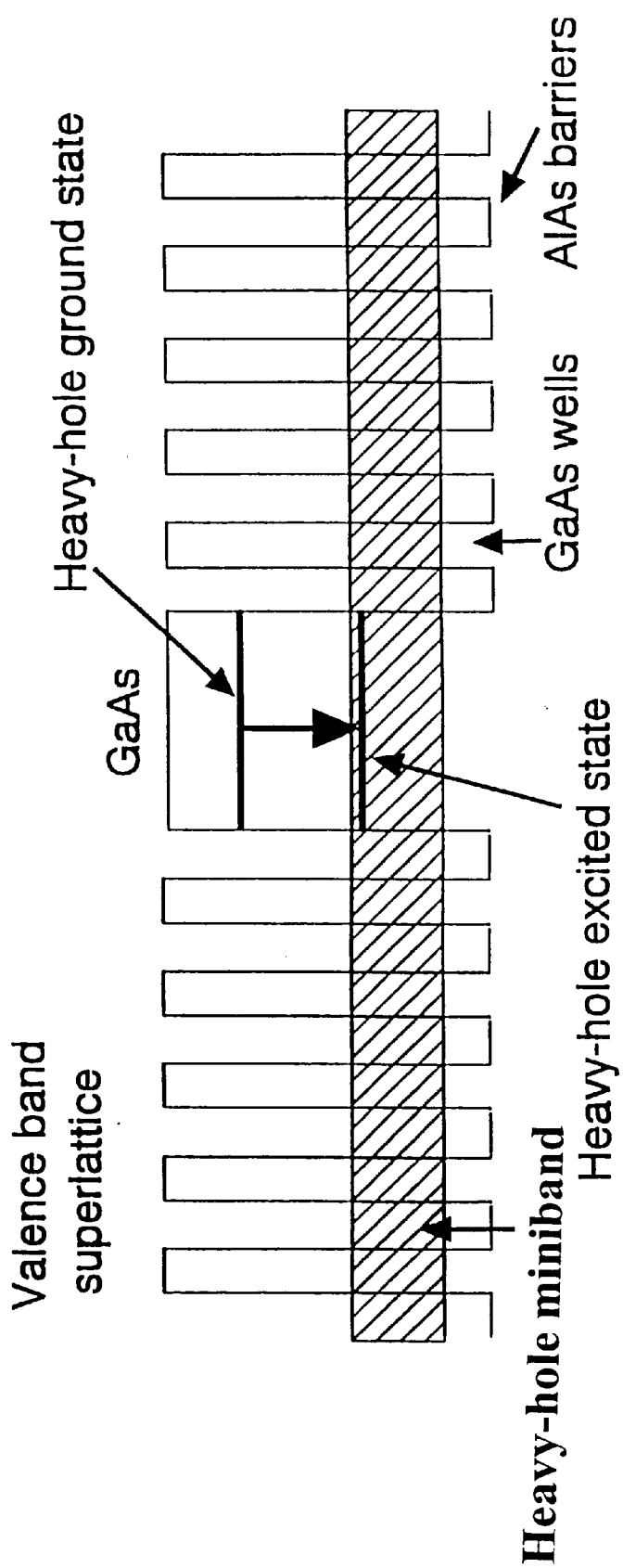
FIG. 16 illustrates the energy states of a p-type miniband transport quantum well detector in accordance with the present invention.

FIG. 16 illustrates the energy states of another MBT detector in accordance with Applicant's invention in which the quantum well layers would be doped with p-type impurities such as beryllium. In addition, the layer thicknesses and compositions would be chosen such that the excited state of heavy holes in the wells' valence band is in resonance with a heavy-hole miniband formed in the valence band of the superlattice barrier layers. Such a p-type MBT detector having a peak-response wavelength of about 10 μm could have 41-Å-wide GaAs quantum wells doped to a concentration of about $3\times10^{18}$ cm$^{-3}$ and superlattice barrier layers comprising thin alternating layers of GaAs (14-Å-wide wells) and AlAs (14-Å-wide barriers). For such compositions and thicknesses, the superlattice barrier layers would have a heavy-hole miniband that is approximately 32 meV wide.

Such p-type MBT detectors would have significant potential advantages, one of which would be operation at higher temperature. For a given doping level, the thermionic emission of heavy holes would be much lower than the thermionic emission of electrons because the fermi level for heavy holes does not increase with increasing temperature nearly as rapidly as it does for electrons. On the other hand, the minibands of p-type MBT detectors tend to be narrower than those of n-type MBT detectors because of the heavy holes' larger effective mass, although a heavy hole miniband that is 50 meV wide is described in the above-cited Leavitt et al. paper, which is incorporated here by reference. As described above, a narrower miniband would require lower applied bias to avoid localization. Moreover, it will be appreciated that it is not possible for a conventional QWIP to have only one bound hole state, an excited hole state near the top of the barrier, and a transition energy that yields response in the LWIR band.

Applicant's invention provides an electromagnetic detector having optical and carrier-transport properties that can be varied over a wide range by selecting among a variety of quantum well widths and compositions and superlattice barrier layer thicknesses and compositions. The optical bandwidth of the detector can be tailored by positioning the wells' excited state energies in a predetermined pattern within the superlattice barriers' miniband, and improved optical performance for imaging detector arrays results. An MBT detector having response in two or more wavelength bands can be formed. By avoiding the conventional QWIP's restriction to only one bound state, MBT detectors in accordance with Applicant's invention can use p-type dopants and obtain higher-temperature, LWIR operation.

The foregoing description will be understood as being merely illustrative of Applicant's invention, and it is expected that changes and modifications will become apparent to those of ordinary skill in the art. Such changes and modifications that fall within the spirit and scope of the present invention and the following claims are intended to be included therein.

What is claimed is:

1. A semiconductor miniband-transport quantum well detector, comprising:

a substrate;

means, disposed on the substrate, for absorbing incident photons, the absorbing means comprising a multilayer structure including a plurality of quantum well layers, each quantum well layer having a bound ground energy state and a bound excited energy state, and a plurality of superlattice barrier layers, each of said superlatice barrier layers having a miniband of energy states in resonance with the excited energy states of its adjacent quantum well layers; and first and second contact layers disposed on top and bottom surfaces, respectively, of the multilayer structure;

wherein the minibands and excited energy states provide an electrically continuous channel across the layers for carriers excited from the ground energy states to the excited energy states and minibands by absorption of photons when different potentials are applied to the contact layers, and the minibands are at least about fifty meV wide.

2. The detector of claim 1, wherein carriers are excited by absorption of long-wavelength infrared photons.

3. The detector of claim 1, wherein the excited states are positioned in a predetermined pattern in the minibands.

4. The detector of claim 3, wherein the predetermined pattern comprises at least a first quantum well's excited energy state positioned near the bottom of the minibands, at least a second quantum well's excited energy state positioned near the middle of the minibands, and at least a third quantum well's excited energy state positioned near the top of the minibands.

5. The detector of claim 1, wherein the quantum well layers comprise doped gallium arsenide.

6. The detector of claim 5, wherein each superlattice barrier layer includes a plurality of alternating layers of gallium arsenide and aluminum gallium arsenide.

7. The detector of claim 5, wherein the quantum well layers comprise gallium arsenide doped to a predetermined concentration with a p-type dopant and each superlattice barrier layer includes a plurality of alternating layers of gallium arsenide and aluminum arsenide.

8. The detector of claim 1, wherein the quantum well layers comprise indium gallium arsenide.

9. A two-color semiconductor miniband transport quantum well detector, comprising:

a substrate;

first means, disposed on the substrate, for absorbing photons of a first wavelength band, the first absorbing means comprising a multilayer structure including a first plurality of quantum well layers interleaved with superlattice barrier layers, the layers having predetermined thicknesses and compositions;

first and second contact layers disposed on top and bottom surfaces, respectively, of the first multilayer structure;

second means, disposed on the first contact layer, for absorbing photons of a second wavelength band, the second absorbing means comprising a second multilayer structure including a second plurality of quantum well layers interleaved with superlattice barrier layers, the layers having predetermined thicknesses and compositions; and a third contact layer disposed on the second multilayer structure distal from the first multilayer structure;

wherein each quantum well layer has a bound ground energy state and a bound excited energy state, each superlattice barrier layer has a miniband of energy states in resonance with the excited energy states of its adjacent quantum well layers, the minibands and excited energy states provide an electrically continuous channel across the layers of each respective multilayer structure for carriers excited by absorption of photons when different electric potentials are applied to the contact layers, and the minibands are at least approximately fifty meV wide.

10. The detector of claim 9, wherein the first wavelength band is medium-wavelength infrared, and the second wavelength band is long-wavelength infrared.

11. The detector of claim 10, wherein the quantum well layers of the first multilayer structure each comprise indium gallium arsenide, the superlattice barrier layers of the first multilayer structure each comprise interleaved layers of aluminum gallium arsenide, the quantum well layers of the second multilayer structure each comprise doped gallium arsenide, and the superlattice barrier layers of the second multilayer structure each comprise interleaved layers of aluminum gallium arsenide and gallium arsenide.

12. A broad-band semiconductor miniband-transport quantum well detector, comprising:

a substrate;

means, disposed on the substrate, for absorbing incident photons, the absorbing means comprising a multilayer structure including a first plurality of first quantum well layers, each first layer having a bound ground energy state and a bound excited energy state, a second plurality of second quantum well layers, each second layer having a bound ground energy state and a bound excited energy state, a third plurality of third quantum well layers, each third layer having a bound ground energy state and a bound excited energy state, and a plurality of superlattice barrier layers disposed between proximate ones of the first, second, and third quantum well layers, each superlattice barrier layer having a miniband of energy states in resonance with the excited energy states of its adjacent quantum well layers; and first and second contact layers disposed on top and bottom surfaces, respectively, of the multilayer structure;

wherein the minibands and excited energy states provide an electrically continuous channel across the layers for carriers excited from the ground energy states to the excited energy states and minibands by absorption of photons when different electric potentials are applied to the contact layers, the excited energy states of the first quantum well layers are positioned near the bottom of the minibands, the excited energy states of the second quantum well layers are positioned near the middle of the minibands, and the excited energy states of the third quantum well layers are positioned near the top of the minibands.

13. The detector of claim 12, wherein the second plurality is greater than at least one of the first and third pluralities.

14. The detector of claim 12, wherein each first quantum well layer comprises doped gallium arsenide having a first predetermined thickness, each second quantum well layer comprises doped gallium arsenide having a second predetermined thickness that is less than the first predetermined thickness, and each third quantum well layer comprises doped gallium arsenide having a third predetermined thickness that is less than the first and second predetermined thicknesses.

15. A semiconductor device for detecting electromagnetic radiation, comprising;

a plurality of doped quantum well layers, each doped quantum well layer comprising a bound ground energy state and one of a plurality of different bound excited energy states;

a plurality of superlattice barrier layers interleaved with the quantum well layers, each superlattice layer having a miniband of energy states in resonance with the excited energy states of its adjacent quantum well layers and strongly coupled to other minibands, said plurality of bound excited energy states of the quantum well layers being arranged in a predetermined pattern within the minibands of energy states of said superlattice barrier layers;

whereby carriers excited from the ground states to the excited energy states and miniband states by absorption of photons of electromagnetic radiation are transported for collection when an electric field is applied across the quantum well layers and the superlattice barrier layers.

16. A semiconductor for detecting electromagnetic radiation, comprising:

a plurality of doped quantum well layers, each doped quantum well layer comprising a bound ground energy state and one of a plurality of different bound excited energy states;

a plurality of superlattice barrier layers interleaved with the quantum well layers, each superlattice layer having a miniband of energy states in resonance with the excited energy states of its adjacent quantum well layers and strongly coupled to other minibands, said plurality of bound excited energy states of the quantum well layers being arranged in a predetermined pattern within the minibands of energy states of said superlattice barrier layers;

whereby carriers excited from the ground states to the excited energy states and miniband states by absorption of photons of electromagnetic radiation are transported for collection when an electric field is applied across the quantum well layers and the superlattice barrier layers, wherein said minibands are at least approximately fifty meV wide.

17. A semiconductor for detecting electromagnetic radiation, comprising:

a plurality of doped quantum well layers, each doped quantum well layer comprising a bound ground energy state and one of a plurality of different bound excited energy states;

a plurality of superlattice barrier layers interleaved with the quantum well layers, each superlattice layer having a miniband of energy states in resonance with the excited energy states of its adjacent quantum well layers and strongly coupled to other minibands, said plurality of bound excited energy states of the quantum well layers being arranged in a predetermined pattern within the minibands of energy states of said superlattice barrier layers;

whereby carriers excited from the ground states to the excited energy states and miniband states by absorption of photons of electromagnetic radiation are transported for collection when an electric field is applied across the quantum well layers and the superlattice barrier layers, wherein said minibands are at least approximately fifty meV wide; and wherein said predetermined pattern comprises at least a first quantum well's excited energy state positioned near the bottom of the minibands, at least a second quantum well's excited energy state positioned near the middle of the minibands, and at least a third quantum well's excited energy state positioned near the top of the minibands.

18. A semiconductor miniband-transport quantum well detector, comprising:

a substrate;

absorbing means, disposed on the substrate, for absorbing incident photons, the absorbing means comprising a multilayer structure including a plurality of quantum well layers, each quantum well layer having a bound ground energy state and a bound excited energy state responsive to the photons, and a plurality of superlattice barrier layers interleaved between the quantum well layers, each superlattice barrier layer having a miniband of energy states in resonance with the excited energy states of its adjacent quantum well layers;

first and second contact layers disposed on top and bottom surfaces, respectively, of the multilayer structure; and wherein the minibands and the excited energy states provide an electrically continuous channel across the layers for carriers excited from the ground energy states and minibands by absorption of photons when different electric potentials are applied to the contact layers, and wherein the excited states are positioned in a predetermined pattern of plural different energy states within the minibands.

19. The detector of claim 18, wherein carriers are excited by absorption of long-wavelength infrared photons.

20. A semiconductor miniband-transport quantum well detector, comprising:

a substrate;

absorbing means, disposed on the substrate, for absorbing incident photons, the absorbing means comprising a multilayer structure including a plurality of quantum well layers, each quantum well layer having a bound ground energy state and a bound excited energy state responsive to the photons, and a plurality of superlattice barrier layers interleaved between the quantum well layers, each superlattice barrier layer having a miniband of energy states in resonance with the excited energy states of its adjacent quantum well layers;

first and second contact layers disposed on top and bottom surfaces, respectively, of the multilayer structure; and wherein the minibands and the excited energy states provide an electrically continuous channel across the layers for carriers excited from the ground energy states and minibands by absorption of photons when different electric potentials are applied to the contact layers, and wherein the excited states are positioned in a predetermined pattern of plural different energy states within the minibands, wherein the predetermined pattern comprises excited energy states positioned near the bottom, middle, and top of the minibands.

* * * * *